US012644861B2

(12) United States Patent
Pansodtee et al.

(10) Patent No.: US 12,644,861 B2
(45) Date of Patent: Jun. 2, 2026

(54) MODULAR MULTI-CHANNEL POTENTIOSTAT

(71) Applicant: The Regents of the University of California, Oakland, CA (US)

(72) Inventors: Pattawong Pansodtee, Santa Cruz, CA (US); Mircea Teodorescu, Santa Cruz, CA (US); Marco Rolandi, Santa Cruz, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 414 days.

(21) Appl. No.: 18/084,801

(22) Filed: Dec. 20, 2022

(65) Prior Publication Data

US 2023/0194471 A1     Jun. 22, 2023

Related U.S. Application Data

(60) Provisional application No. 63/291,516, filed on Dec. 20, 2021.

(51) Int. Cl.
G01N 27/48          (2006.01)
G01N 27/447          (2006.01)
(Continued)

(52) U.S. Cl.
CPC ....... G01N 27/48 (2013.01); G01N 27/44721 (2013.01); H03K 19/017509 (2013.01); H05K 1/144 (2013.01); H05K 1/181 (2013.01)

(58) Field of Classification Search
CPC ...... G01N 27/48; G01N 27/49; G01N 27/028; G01N 27/045; G01N 27/327;
(Continued)

(56) References Cited

U.S. PATENT DOCUMENTS 6,187,164 B1 * 2/2001 Warren ................ B01J 19/0046
                                                          205/136

OTHER PUBLICATIONS

"Open-Hardware Electronic Embedded Systems for Biological Cell Culturing," by Pattawong Pansodtee, PhD thesis, University of California, Santa Cruz, Dec. 2021.

(Continued)

*Primary Examiner* — Gurpreet Kaur
(74) *Attorney, Agent, or Firm* — GATES & COOPER LLP

(57)          ABSTRACT

A potentiostat is an essential piece of analytical equipment for studying electrochemical devices and reactions. As the design of electrochemical devices evolve, applications for systems with multiple working electrodes have become more common. These applications drive a need for low-cost multi-channel potentiostat systems. Embodiments describe herein include a portable, low-cost and scalable system with a modular design that can support 8 to 64 channels at a cost as low as $8 per channel. This design can replace the functionality of commercial potentiostats which cost upwards of $10k for certain applications. Each channel in the multi-channel potentiostat has an independent adjustable voltage source with a built-in ammeter and switch, making the device flexible for various configurations. The multi-channel potentiostat can be designed for low current applications (nA range), but its purpose can change by varying its shunt resistor value. The system can either function as a standalone device or remotely controlled. We demonstrate the functionality of this system for the control of a 24-channel bioelectronic ion pump for open- and closed-loop control of pH.

20 Claims, 15 Drawing Sheets

(51) Int. Cl.
    *H03K 19/0175*      (2006.01)
    *H05K 1/14*         (2006.01)
    *H05K 1/181*       (2026.01)

(58) Field of Classification Search
    CPC ........... G01N 27/3272; G01N 27/3273; G01N
              27/416; G01N 27/4161; G01N 27/44721;
                                  H03K 19/017509
    See application file for complete search history.

(56) References Cited

OTHER PUBLICATIONS

Adams S, Buber E, Bicak T, Yagci Y, Toppare L, Kaynak A, et al. A miniature and low-cost glucose measurement system. Biocybernetics and Biomedical Engineering. 2018; 38(4):841-849. https://doi.org/10.1016/j.bbe.2018.07.004.

Adams SD, Doeven EH, Quayle K, Kouzani AZ. MiniStat: Development and evaluation of a mini-potentiostat for electrochemical measurements. IEEE Access. 2019; 7:31903-31912.

Ainla A, Mousavi MP, Tsaloglou MN, Redston J, Bell JG, Ferna'ndez-Abedul MT, et al. Open-source potentiostat for wireless electrochemical detection with smartphones. Analytical chemistry. 2018; 90 (10):6240-6246. https://doi.org/10.1021/acs.analchem.8b00850 PMID: 29658268.

BV MA. Metrohm Autolab—hardware specification; 2020 (accessed Apr. 23, 2020). Available from: https://www.metrohm-autolab.com/download/Autolab_Brochure_2013_EN_LR.pdf.

Cruz AFD, Norena N, Kaushik A, Bhansali S. A low-cost miniaturized potentiostat for point-of-care diagnosis. Biosensors and Bioelectronics. 2014; 62:249-254. https://doi.org/10.1016/j.bios.2014.06.053 PMID: 25016332.

Cumyn VK, Fleischauer M, Hatchard T, Dahn JR. Design and testing of a low-cost multichannel pseudopotentiostat for quantitative combinatorial electrochemical measurements on large electrode arrays. Electrochemical and Solid-State Letters. 2003; 6(6):E15-E18. https://doi.org/10.1149/1.1570031.

Dobbelaere T, Vereecken PM, Detavernier C. A USB-controlled potentiostat/galvanostat for thin-film battery characterization. HardwareX. 2017; 2:34-49. https://doi.org/10.1016/j.ohx.2017.08.001.

Dryden MD, Wheeler AR. DStat: A versatile, open-source potentiostat for electroanalysis and integra-tion. PloS one. 2015; 10(10):e0140349. https://doi.org/10.1371/journal.pone.0140349 PMID: 26510100.

Friedman ES, Rosenbaum MA, Lee AW, Lipson DA, Land BR, Angenent LT. A cost-effective and field-ready potentiostat that poises subsurface electrodes to monitor bacterial respiration. Biosen-sors and Bioelectronics. 2012; 32(1):309-313. https://doi.org/10.1016/j.bios.2011.12.013 PMID: 22209069.

Glasscott MW, Verber MD, Hall JR, Pendergast AD, McKinney CJ, Dick JE. SweepStat: A Build-It-Yourself,y Two-Electrode Potentiostat for Macroelectrode and Ultramicroelectrode Studies; 2019.

Hoilett OS, Walker JF, Balash BM, Jaras NJ, Boppana S, Linnes JC. KickStat: A Coin-Sized Potentiostat for High-Resolution Electro-chemical Analysis. Sensors. 2020; 20(8):2407. https://doi.org/10.3390/ s20082407 PMID: 32340294.

Inc NS. Arraystat—The ultimate tool for high throughput electro-chemistry; 2011 (accessed Apr. 23, 2020). Available from: http://nuvant.com/arraystat/arraystat.pdf.

Jafari M, Marquez G, Selberg J, Jia M, Dechiraju H, Pansodtee P, et al. Feedback Control of Bioelectronic Devices Using Machine Learning. IEEE Control Systems Letters. 2020.

Jenkins DM, Lee BE, Jun S, Reyes-De-Corcuera J, McLamore ES. ABE-Stat, a fully open-source and versatile wireless potentiostat project including electrochemical impedance spectroscopy. Journal of The Electrochemical Society. 2019; 166(9):B3056. https://doi.org/10.1149/2.0061909jes.

Li H, Luo X, Liu C, Jiang L, Cui D, Cai X, et al. Multi-channel electrochemical detection system based on LabVIEW. In: Interna-tional Conference on Information Acquisition, 2004. Proceedings. IEEE; 2004.p. 224-227.

Li YC, Melenbrink EL, Cordonier GJ, Boggs C, Khan A, Isaac MK, et al. An easily fabricated low-cost potentiostat coupled with user-friendly software for introducing students to electrochemical reactions and electroanalytical techniques; 2018.

Meloni GN. Building a microcontroller based potentiostat: A inex-pensive and versatile platform for teaching electrochemistry and instrumentation; 2016.

P. Emstat 3—hardware specification; 2020 (accessed Apr. 23, 2020). Available from: https://www. palmsens.com/shared/content/uploads/2020/04/EmStat-series-description.pdf.

Pansodtee P, Selberg J, Jia M, Jafari M, Dechiraju H, Thomsen T, et al., "The multi-channel potentiostat: Development and evaluation of a scalable mini-potentiostat array for investigating electrochemi-cal reaction mechanisms", PLoS ONE 16(9):e0257167, (2021). https://doi.org/10.1371/journal.pone.0257167.

Rowe AA, Bonham AJ, White RJ, Zimmer MP, Yadgar RJ, Hobza TM, et al. CheapStat: an open-source,"Do-It-Yourself" potentiostat for analytical and educational applications. PloS one. 2011; 6(9). https:// doi.org/10.1371/journal.pone.0023783 PMID: 21931613.

Selberg J, Jafari M, Bradley C, Gomez M, Rolandi M. Expanding biological control to bioelectronics with machine learning. APL Materials. 2020; 8(12):120904. https://doi.org/10.1063/5.0027226.

* cited by examiner

The Ion pump shown in Figure 6 (A)

Fluorescence microscope

The Multi-channel Potentiostat shown in Figure 2

100

202

200

Stackable
board #1-3
212

218

Raspberry
Pi 3
Model B+
210

Base unit
202

The assembled system

Power rails port

GPIO port

~1V65 and 2V8 REG

-5V REG

5V REG

Shift register port

I2C ports

I2C Multiplexer 206

Realtime-clock 208

PWR IN

3V3 REG

Base board

I2C port

Power rails port

220 DAC

222 Scale and shifted

226 Level Shifter

Shift register in and out ports

Output port

214

Analog switches 219

Shift register 230

Current to Voltage 224

ADC 228

Stackable board

The Multi-channel potentiostat output voltage vs. DAC voltage

Output voltage error

Output voltage vs. input current for the "current to voltage" modules input current error (Fig. 3)

"current to voltage" modules (Fig. 3)

The multi-channel potentiostat Load test using a 1MΩ resistor

The multi-channel potentiostat Load test errors

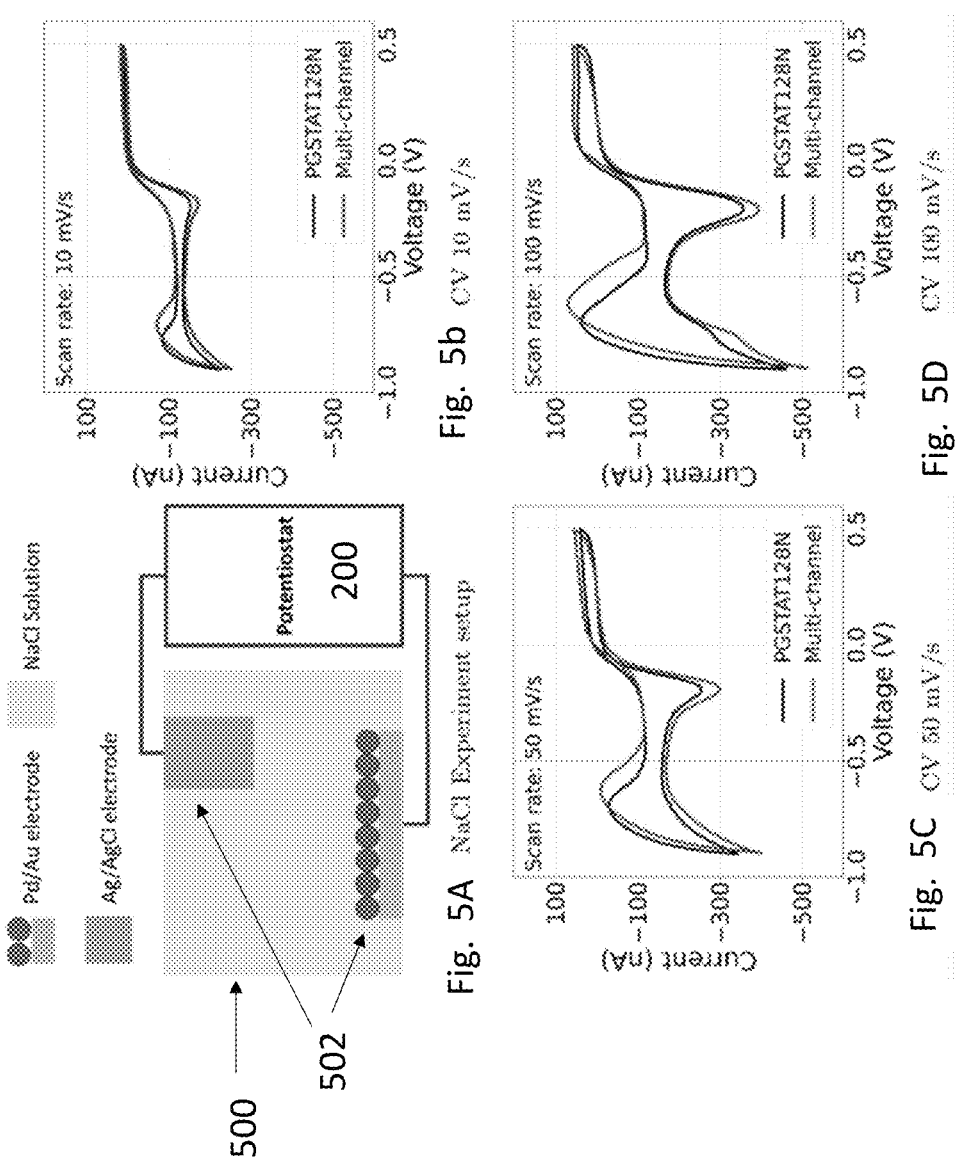

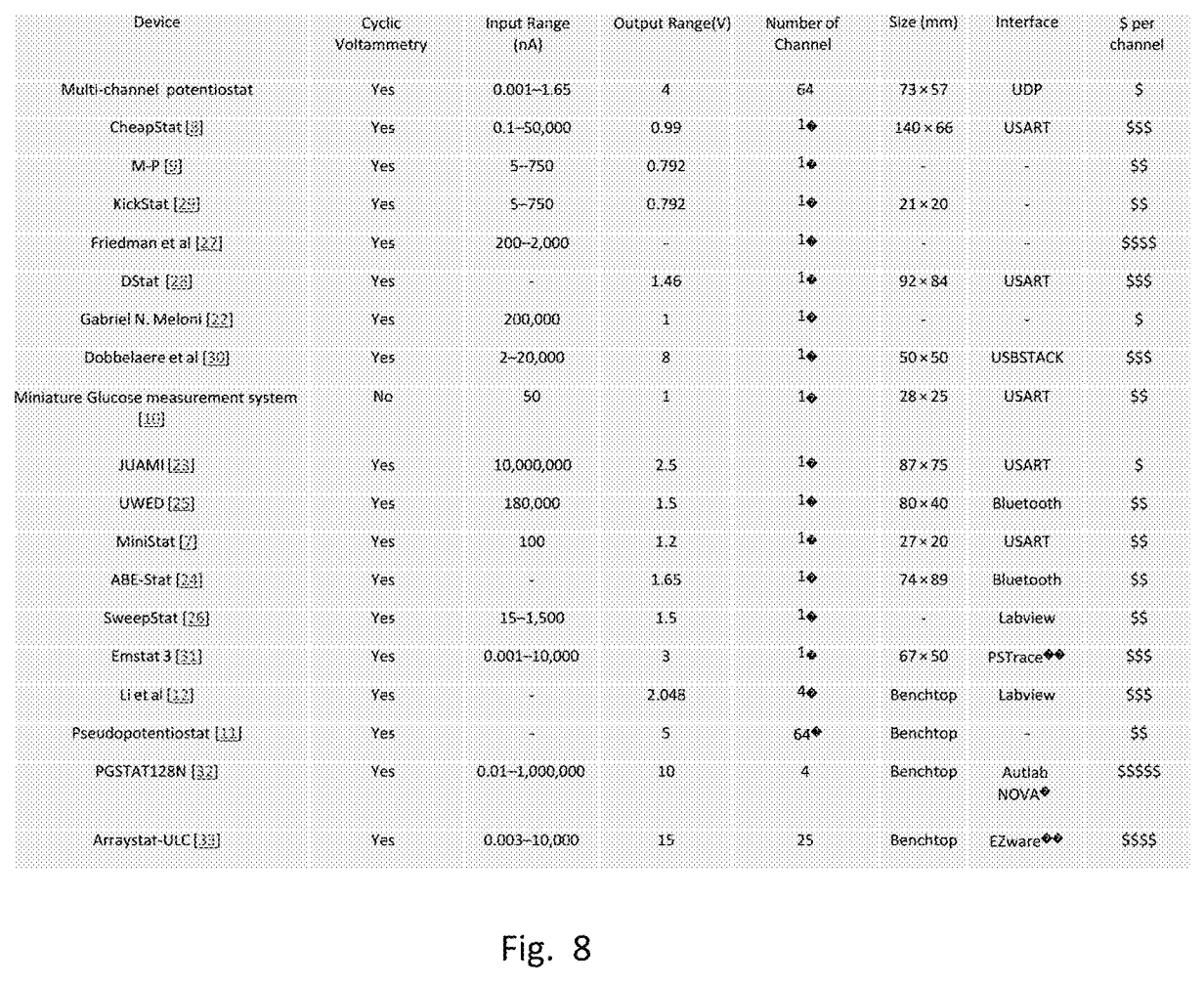

| Device | Cyclic Voltammetry | Input Range (nA) | Output Range(V) | Number of Channel | Size (mm) | Interface | $ per channel |
|---|---|---|---|---|---|---|---|
| Multi-channel potentiostat | | | | | | | |
| CheapStat [33] | Yes | 0.001-1.65 | 4 | 64 | 73×57 | UDP | $ |
| M-P [?] | Yes | 0.1-50,000 | 0.99 | 1♦ | 140×66 | USART | $$$ |
| KickStat [?] | Yes | 5-750 | 0.792 | 1♦ | - | - | $$ |
| KickStat [?] | Yes | 5-750 | 0.792 | 1♦ | 21×20 | - | $$ |
| Friedman et al [?] | Yes | 200-2,000 | - | 1♦ | - | - | $$$$ |
| DStat [?] | Yes | - | 1.46 | 1♦ | 92×84 | USART | $$$ |
| Gabriel N. Meloni [?] | Yes | 200,000 | 1 | 1♦ | - | - | $ |
| Dobbelaere et al [?] | Yes | 2-20,000 | 8 | 1♦ | 50×50 | USBSTACK | $$$ |
| Miniature Glucose measurement system [?] | No | 50 | 1 | 1♦ | 28×25 | USART | $$ |
| JUAMI [?] | Yes | 10,000,000 | 2.5 | 1♦ | 87×75 | USART | $ |
| UWED [?] | Yes | 180,000 | 1.5 | 1♦ | 80×40 | Bluetooth | $$ |
| MiniStat [?] | Yes | 100 | 1.2 | 1♦ | 27×20 | USART | $$ |
| ABE-Stat [?] | Yes | - | 1.65 | 1♦ | 74×89 | Bluetooth | $$ |
| SweepStat [?] | Yes | 15-1,500 | 1.5 | 1♦ | - | Labview | $$ |
| Emstat 3 [?] | Yes | 0.001-10,000 | 3 | 1♦ | 67×50 | PSTrace♦♦ | $$$ |
| Li et al [?] | Yes | - | 2.048 | 4♦ | Benchtop | Labview | $$$ |
| Pseudopotentiostat [?] | Yes | - | 5 | 64♦♦ | Benchtop | - | $$ |
| PGSTAT128N [?] | Yes | 0.01-1,000,000 | 10 | 4 | Benchtop | Autlab NOVA♦ | $$$$$$ |
| Arraystat-ULC [?] | Yes | 0.003-10,000 | 15 | 25 | Benchtop | EZware♦♦ | $$$$ |

Fig. 8

MODULAR MULTI-CHANNEL POTENTIOSTAT

CROSS REFERENCE TO RELATED APPLICATIONS

This application claims the benefit under 35 U.S.C. Section 119(e) of the following commonly-assigned U.S. Provisional Patent Applications Ser. No. 63/291,516 filed on Dec. 20, 2021, entitled "MODULAR MULTI-CHANNEL POTENTIOSTAT" by Pattawong Pansodtee, Mircea Teodorescu, and Marco Rolandi, which application is incorporated by reference herein.

STATEMENT REGARDING FEDERALLY SPONSORED RESEARCH AND DEVELOPMENT

This invention was made with Government support under Grant No. W911NF-17-1-0460 and W911NF-18-2-0104, awarded by the Defense Advanced Research Projects Agency. The Government has certain rights in the invention

BACKGROUND OF THE INVENTION

1. Field of the Invention

The present disclosure relates to potentiostats and methods of making the same.

2. Description of the Related Art

In the last few decades, the use of miniaturized electrochemical devices has grown rapidly and found diverse applications in scientific and consumer products (e.g., batteries [1], Glucose sensors [2, 3], and breathalyzers [4]). Unfortunately, the process of developing specialized electrochemical devices is often time-consuming and expensive [5]. Electro-chemical experimental setups use measurement equipment such as a potentiostat. A potentiostat is an instrument that controls the voltage between two or more electrodes. It is an essential piece of measurement equipment used to investigate electrochemical reaction. The accuracy and precision of the applied or measured voltages and currents depends on the quality of the electronic hardware, which for commercially available potentiostats, often correlate with the price and portability of each unit. Consequently, one of the challenges faced by the research community is how to test and operate electrochemical devices with less expensive and more portable equipment without compromising the quality of the experiment [7]. The present disclosure satisfies this need.

SUMMARY OF THE INVENTION

A unique modular multi-channel potentiostat that can operate multiple electrochemical devices or a single electrochemical device with more than one (e.g., working) electrode. Embodiments described herein comprise a versatile design comprising current measurement hardware, modular considerations, and versatile software that can be cheaper and easier to replicate and implement for a variety of applications. For example, in one implementation, the potentiostat is open-source, multi-channel, low-cost, low-current, and scalable.

The modular aspect allows the multi-channel potentiostat to scale (e.g., from 8 to at least 64 channels) by adding more stackable boards, for example. The architecture, including output, input stages, can be designed to achieve a wide output range, and low current measurement capability independently over multiple channels. In one example, the device provides multi-channel actuation with simultaneous current recording. In yet a further example, each of the (e.g., 64) parallel potentiostats have independently adjustable voltage sources $\pm 4$ V and with maximum currents $\pm 1.5$ μA.

In one example application, the multi-channel portable electrochemical array controllerallows users to conduct experiments with complex electrochemical cells (more than three-electrodes) in aqueous and non-aqueous solutions. An illustrative device is validated in a cyclic-voltammetry experiment against a commercial system (Autolab PGSTAT128N) on Palladium microelectrode, AgCl electrode in NaCl solution. As a further demonstration of the device's functionality, we used the multi-channel potentiostat to control an ion pump that had one AgCl electrode in a NaCl solution and nine palladium individual target micro-electrodes. The amperometry results show good agreement with the actuation voltage and the fluorescent results. The system is also used to perform amperometry on an array of electrophoretic ion pumps [15, 16], to show a correlation between the electrical currents and changes in fluorescent intensity.

The device can be remotely or locally controlled, in one example, the modular multi-channel potentiostat offers an external control mode allowing interfacing with external software such as a machine learning control algorithm. For example, the device could be remotely controlled via API enabling integration with other laboratory system, such as an ion pump closed-loop controlled to monitor the changes into the ion concentration through imaging it using a fluorescent microscope. An external laptop running the machine learning control algorithm performs closed-loop control on electrophoretic ion pumps with feedback from fluorescent imaging.

A multi-channel potentiostat according to embodiments described herein may be an ideal solution for applications that are not feasible for bench-top potentiostats, and where a high degree of accuracy is not required (e.g., field-testing and point-of-care, or applications where performance of a bench-top potentiostat performing more proficiently in similar conditions is not required).

Illustrative embodiments of the inventive subject matter include, but are not limited to, the following.

1. A modular, multi-channel potentiostat, comprising:
   a base printed circuit board;
   a power supply; a multiplexer; a clock; and a computer mounted on and electrically connected to the base printed circuit board; and
   one or more modules each comprising a stackable printed circuit board, wherein each module comprises a potentiostat circuit connectable to the base printed circuit board, wherein the potentiostat circuits each control a voltage between two or more electrodes in an electrochemical cell; and
   a mount capable of attaching a plurality of the stackable printed circuit boards to the base printed circuit board; and
   so that the potentiostat can be configured for controlling a selected plurality of channels each applying one of the voltages and receiving a response from one or more of a selected number of the electrodes.

2. The potentiostat of example 1, wherein each of the potentiostat circuits comprise:

one or more switches for electrically connecting or disconnecting to the electrodes;

an output stage comprising a digital to analog converter (DAC) circuit and a first level shifter circuit, wherein the first level shifter circuit is electrically connected to one or more of the switches and the DAC circuit is electrically connected to the multiplexer; and an input stage comprising a current to voltage converter circuit electrically connected to one or more of the switches; a second level shifter circuit connected to an output of the current to voltage converter circuit; and an analog to digital converter circuit connected to an output of the second level shifter circuit, wherein the ADC circuit is electrically connected to the multiplexer.

3. The potentiostat of example 2; wherein:

the first level shifter circuit scales and/or shifts a DAC voltage output from the DAC circuit to the voltage comprising a desired level applied between the electrodes; and the second level shifter circuit scales and/or shifts a voltage output from the current to voltage circuit into an acceptable range for input to the ADC circuit.

4. The potentiostat of example 2 or 3, wherein the current to voltage converter comprises a shunt resistor connected to an amplifier.

5. The potentiostat of any of the examples 1-4 connected to between 8 and 64 of the electrodes and further comprising a plurality of the stackable printed circuit boards, each of the stackable printed circuit boards connected to a subset of the electrodes so as to control the voltage applied to the subset of the electrodes.

6. The potentiostat of any of the examples 1-5, wherein each of the stackable printed circuit boards simultaneously control the voltage applied to the electrodes comprising between 1-8 electrodes (e.g. one or more two electrode systems).

7. The potentiostat of any of the examples 1-6, wherein the switches connect or disconnect to the electrodes independently.

8. The potentiostat of any of the examples 1-7, wherein the computer comprises one or more processors; one or more memories; and one or more applications stored in the one or more memories, wherein the application executed by the one or more processors:

initializes the DAC, ADC, shift-register, and the clock;

calibrates the potentiostat, comprising:

electrically disconnecting the switches from the electrodes and measuring ADC output voltages outputted from the ADC circuit during a no-load (open circuit) condition so as to obtain measurement recordings; and averaging the measurement recordings to obtain a baseline;

executes a measurement protocol selected by a user, comprising obtaining real-time current measurement values in response to the voltages applied to a sample via the electrodes.

9. The potentiostat of any of the examples 1-8, wherein the computer comprises one or more processors; one or more memories; and one or more applications stored in the one or more memories, wherein one or more of the applications executed by one or more of the processors implement an Application Program Interface (API) allowing a user to control the potentiostat remotely from a remote computer via a wireless or wired connection to the computer.

10. The potentiostat of example 9, wherein the API enables the user, via the remote computer, to configure and set the voltages applied to the electrodes and receive the current measurements outputted from the electrodes in response to the voltages.

11. The potentiostat of any of the examples 8-10, wherein one or more of the applications log timestamps, voltage output of the different electrodes, and current measurements in comma separated values format.

12. The potentiostat of any of the examples 8-11, wherein the one or more applications execute a machine learning algorithm controlling the voltages or analyzing data obtained using the potentiostat.

13. The potentiostat of any of the examples 1-12, wherein the computer comprises a single board computer.

14. The potentiostat of any of the examples 1-12, wherein the computer comprises a Raspberry Pi computer.

15. The potentiostat of any of the examples 1-12, wherein the computer comprises an Application Specific Integrated Circuit or a Field Programmable Gate Array.

16. The potentiostat of any of the examples 2-15, wherein the current to voltage converter circuit receives, via one or more of the switches, one or more currents outputted from one or more of the electrodes in response to one or more voltages outputted from the first level shifter circuit and applied to one or more of the electrodes via one or more of the switches.

17. The potentiostat of example 16, wherein the electrodes are in an electrochemical cell.

18. The potentiostat of any of the examples 2-17, wherein the switches independently connect or disconnect to the electrodes so as to apply the voltages, adjustable in a range of ±4 V, and receive a maximum currents in a range ±1.5 μA, wherein the voltages and maximum currents are independently adjustable for each electrode or pair of electrodes.

19. The potentiostat of any of the examples 1-18, wherein the switches comprise analog switches.

20. An analyte sensor comprising the potentiostat of any of the examples 1-19, wherein one or more of the electrodes are in contact with the analyte and the voltages are applied so as to sense the analyte.

21. The potentiostat of any of the examples 1-20, wherein each of the boards has a length less than 100 millimeters and a width less than 100 millimeters (or a surface area less than 100 mm by 100 mm).

22. An imaging system connected to the potentiostat of any of the examples 1-22 obtaining amperometric data using the voltages applied to the electrodes, wherein the imaging system correlates fluorescence of the sample with amperometric data.

23. The potentiostat of any of the examples 1-22, wherein the potentiostat is dimensioned and configured so as to be portable or carried by hand.

24. The potentiostat of any of the examples, wherein the clock controls timing of the voltages applied to the electrodes and receipt at the electrodes of the response to the voltages.

25. The potentiostat of any of the examples, wherein the multiplexer is configured to control (e.g., magnitude, amplitude, phase and/or timing of) the voltages applied in the selected number of channels to the selected number of electrodes and the power supply provides the power required to supply all the voltages.

26. A method of making a modular, multi-channel potentiostat, comprising:

mounting or attaching a power supply; a multiplexer; a clock; and a computer mounted on and electrically connected to the base printed circuit board; and fabricating and mounting one or more modules each comprising a stackable printed circuit board, wherein each of the modules comprises a potentiostat circuit connected to the base printed circuit board, wherein the potentiostat circuits each control a voltage between two or more electrodes in an electrochemical cell; wherein the stackable printed circuit boards are mounted to the base printed circuit board;

so that the potentiostat can be configured for controlling a selected plurality of channels each applying one of the voltages and receiving a response from one or more of a selected number of the electrodes.

27. The system or potentiostat of any of the examples manufactured using the method of example 26.

BRIEF DESCRIPTION OF THE DRAWINGS

Referring now to the drawings in which like reference numbers represent corresponding parts throughout:

(FIG. 1A) An example of multi-channel potentiostat use cases. The multi-channel potentiostat can be setup in various configurations (e.g. multiple two-electrode devices, single multi-electrode devices). FIG. 1B. Closed-loop control experiment with an ion pump and KEYENCE, BZ-X710 fluorescence microscope. This is also shown in FIG. 6A. (FIG. 1C) Close-up picture of an Ion pump, 9-electrode device.

(FIG. 2A) A 24 channels assembled unit with three stackable boards (FIG. 2B) The base unit attached to the Raspberry Pi 3 B+ (FIG. 2C) Stackable board. For (FIG. 2B) and (FIG. 2C), the main electronic Integrated circuit (IC) are highlighted in Orange and connection ports are highlighted in Red.

(FIG. 3A) The measured output voltage on channels 1 to 8 (−4 to +4 V and a resolution of 1.95 mV) as a function of the DAC voltage. (FIG. 3B) Output voltage error. The output voltage as a function of the input current (−1.65 to +1.65 μA) for the "current to voltage" converter modules shown in FIG. 4. (FIG. 3C) Output voltage vs. Output Current. (FIG. 3D) Input current errors on the "current to voltage" modules (FIG. 3E) multi-channel potentiostat load test. The current passing through a 1MΩ resistor is monitored during a multi-channel potentiostat voltage sweep (−1.65 to +1.65 V) (FIG. 3F) Current errors during the load test.

FIGS. 5A-5D. (FIG. 5A) Experimental CV setup with Pd functionalized Au electrode vs AgCl pellet electrode in NaCl solution. (FIGS. 5B-5D) CV of Pd NP/Au vs AgCl with various scan rates recorded with a commercial potentiostat and the multi-channel potentiostat device. (FIG. 5B) 10 mV/s scan rate (FIG. 5C) 50 mV/s scan rate (FIG. 5D) 100 mV/s scan rate.

(FIG. 6A) Physical configuration of electrode placement of the ion pump. KEYENCE, BZ-X710 fluorescence microscope is used to image proton concentration (pH) every 2 seconds. Various colors represent different working electrodes and the black color indicates unused electrodes. (FIG. 6B) Actuation voltage and Amperometry results of in-house Ion pump and normalized fluorescent intensity correspond directly to Cl— ion concentration. The output shows that Cl— ion concentration changes according to the amperometry results from the ion pump.

FIG. 8. Table 1.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1A:
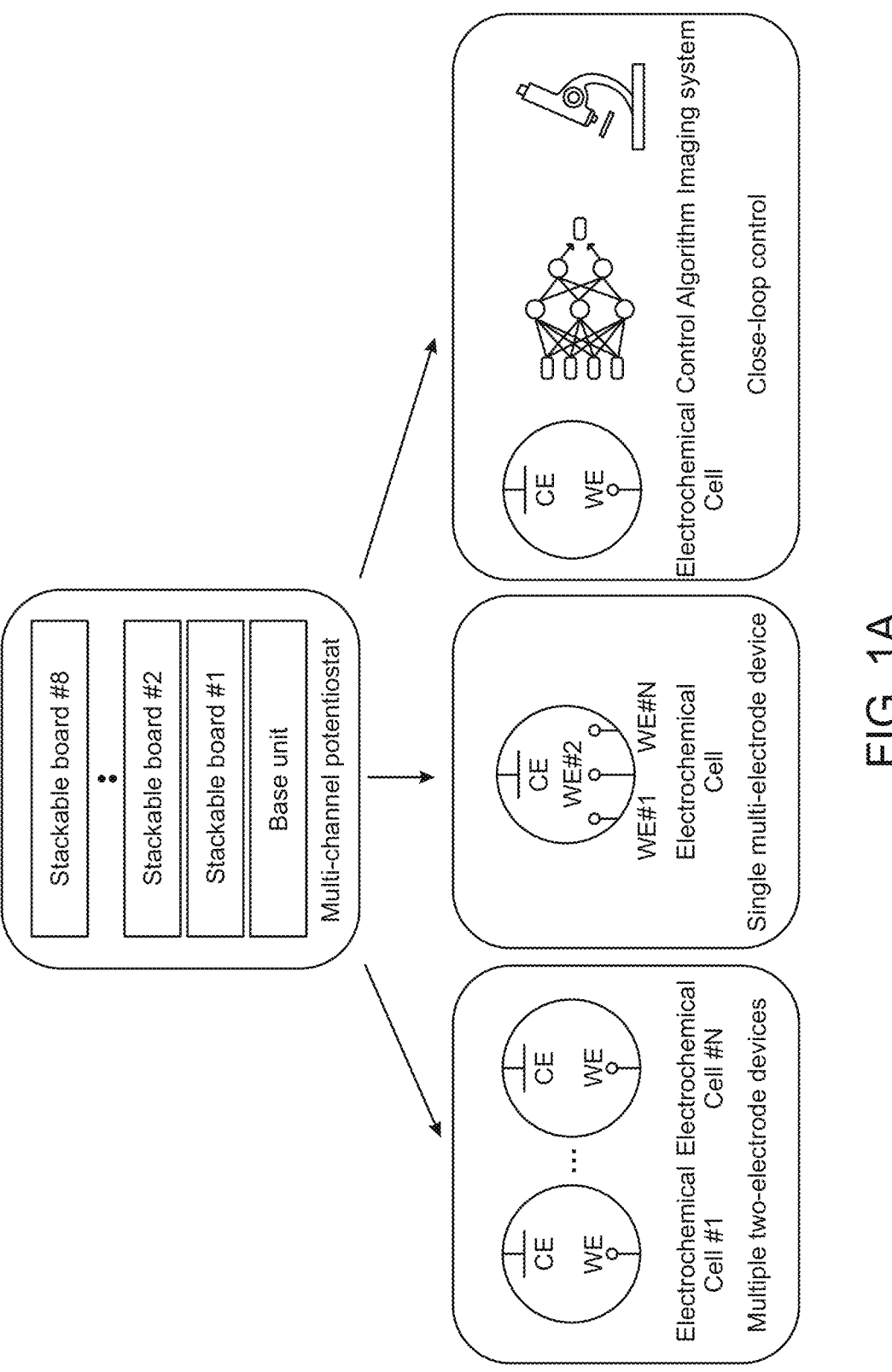
FIGS. 1A-1C. Multi-channel potentiostat.
Figures 1B, 1C:
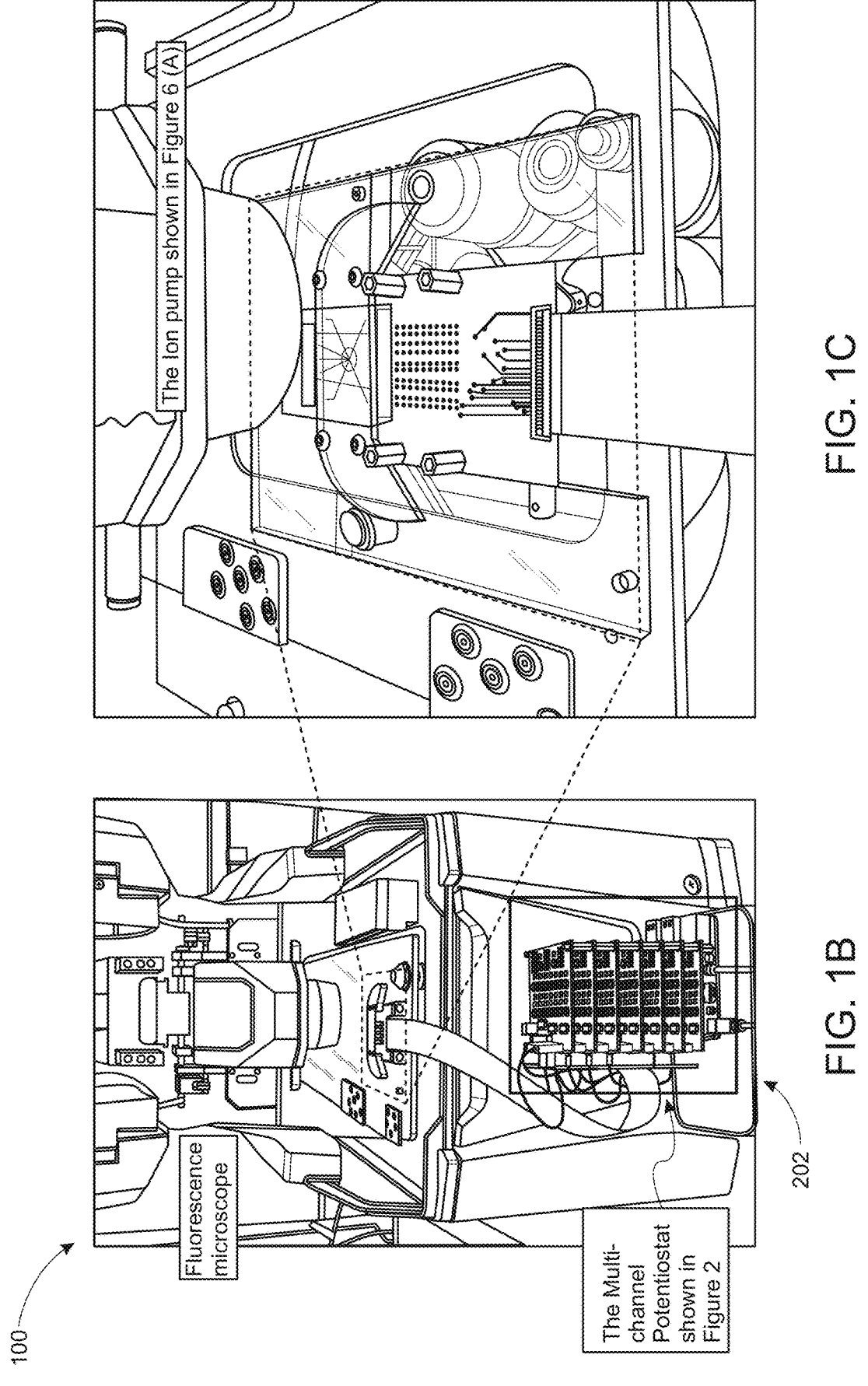

FIG. 1. shows an electro-chemical experimental setup using measurement equipment including a potentiostat controlling the voltage between two or more electrodes so as to investigate an electrochemical reaction. In various examples, the electrochemical reaction can be investigated using two electrodes (a working electrode and a counter electrode) or three electrodes (a working electrode, a counter electrode, and reference electrode). Therefore, illustrative embodiments of the present invention comprise an affordable, scalable, and versatile device that can perform low current cyclic voltammetry and amperometry measurements on various electrode configurations.

First Example Device

Figure 2A:
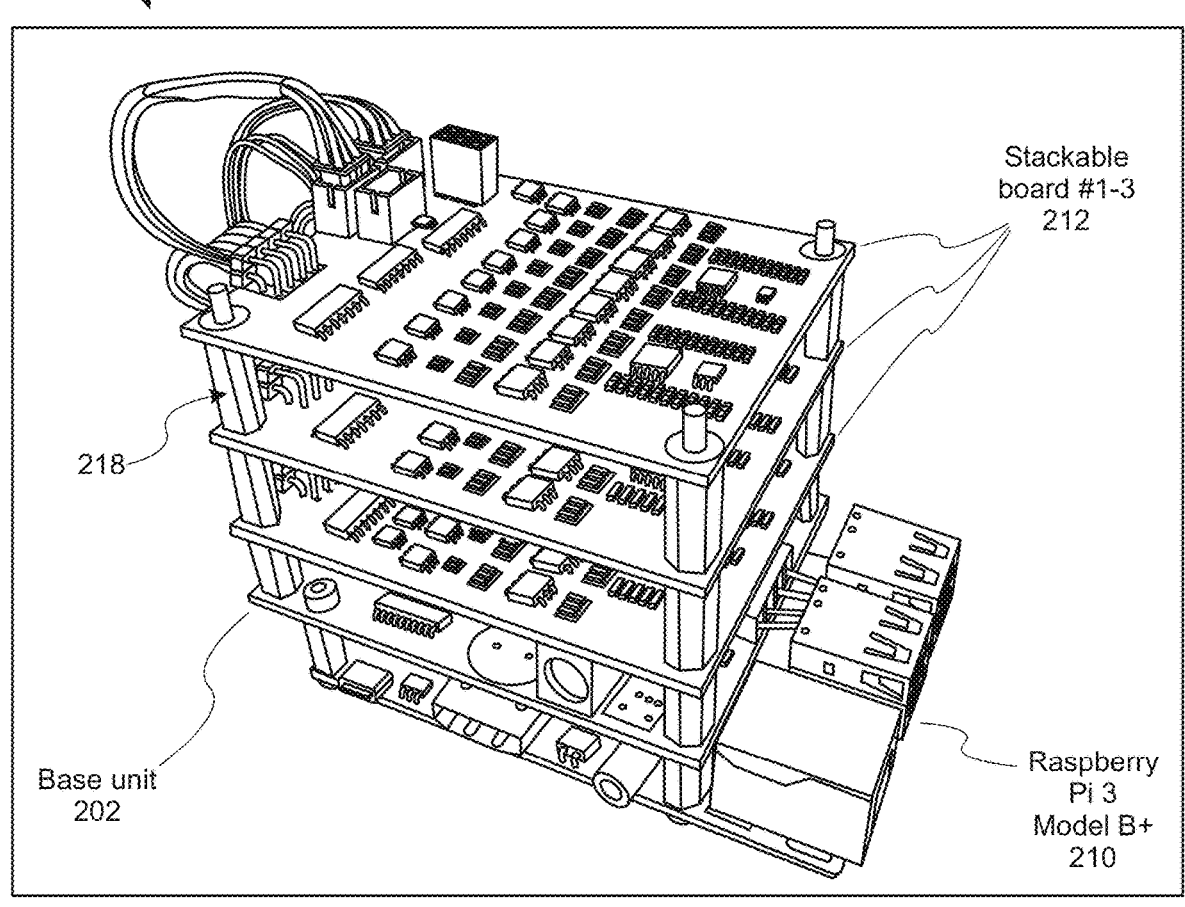
FIGS. 2A-2C. Specific example of the multi-channel potentiostat.
Figure 2B:
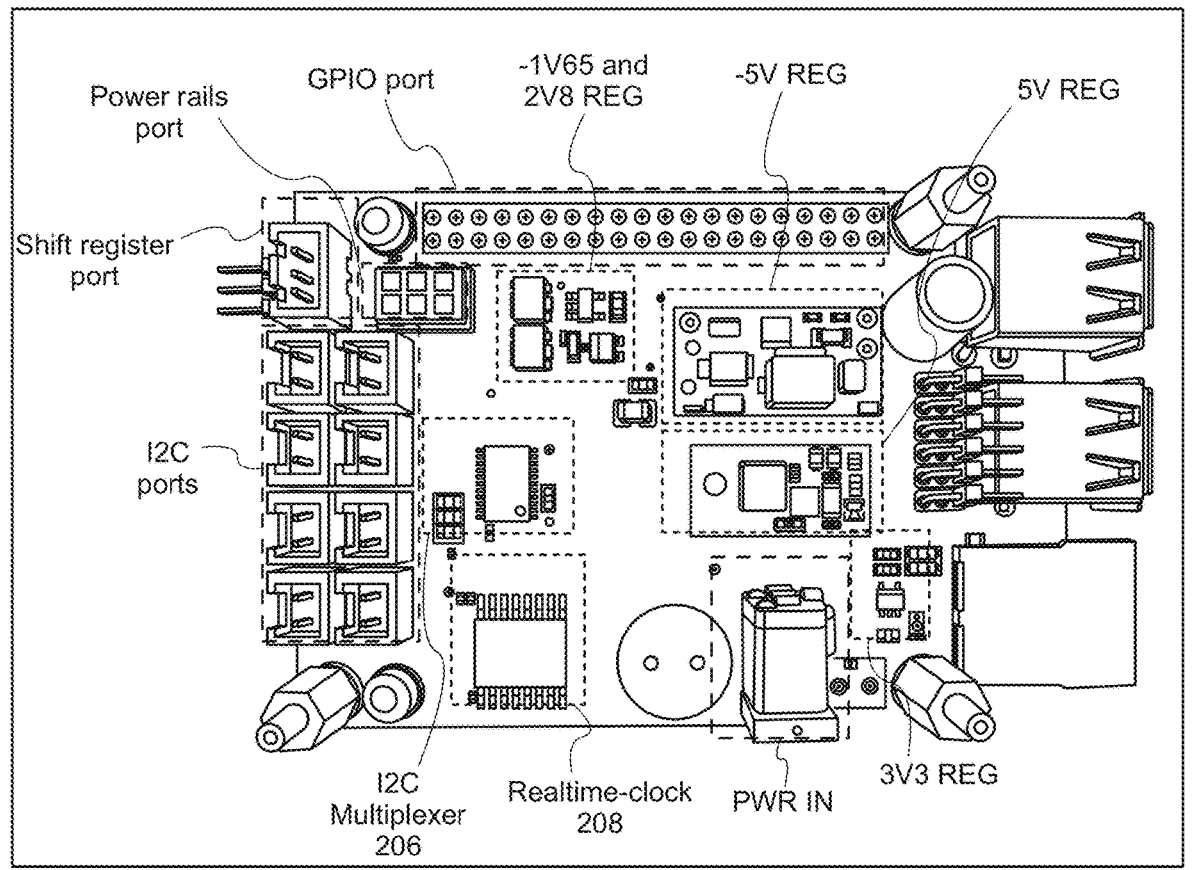
Figure 2C:
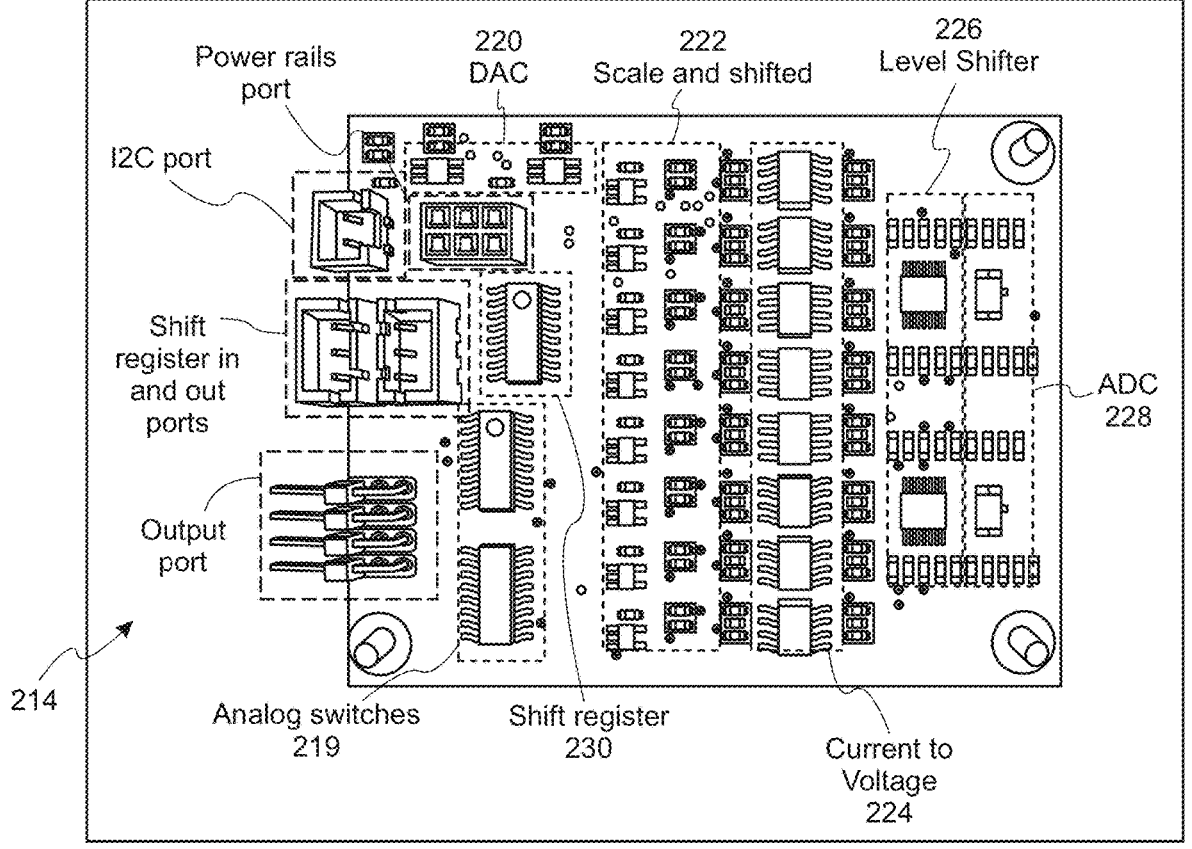

In one embodiment, the device comprises one base unit that attaches to a RaspberryPi 3 B+ board computer and several stackable multi-channel potentiostat boards. FIG. 2 shows an assembled unit (a), the base unit attached to the Raspberry Pi 3 B+ (b), and the stackable board (c). The base unit contains the voltage regulators interfacing with the stackable boards. It consists of a single-board computer (SBC) and a custom Hardware Attached on Top (HAT) printed circuit board (PCB) that provides an interface between the SBC and the stackable boards, as well as supplying the necessary power. In this example, the SBC is a low-cost Raspberry Pi 3 Model B+ computer that has Wi-Fi, Ethernet, 40-GPIO connectivity, and runs Raspbian OS version 10 (Buster) and Python 3.5.

The multi-channel potentiostat has two operation modes, standalone (that operate the multi-channel potentiostat independently) and Application Program Interface (API) mode (the multi-channel potentiostat is externally controlled). The HAT is designed in the form-factor of a Raspberry Pi and can accommodate up to eight stackable boards. The HAT contains +5, −5, +3.3, +2.8, and −1.65 V voltage regulators, TCA9548A, I2C multiplexer, DS3231 real-time clock, and a backup battery. It can interface with a Raspberry Pi via GPIO pin headers, one I2C communication bus, and one shift register bus.

Each stackable board contains eight analog potentiostats with adjustable voltage sources, built-in ammeters, analog switches, and digital communication buses to the base unit. Each board is powered by a six-pin stacking header and interfaces with a Base unit via one of a 4-pin I2C cables. A shift register is either chained with a custom-designed HAT or with another stackable board's port. The most basic configuration consists of one base unit and one stackable board, but this example system has a maximum of eight stackable boards for each single base unit. As a result, the multi-channel potentiostat support ranges from a minimum of 8 channels to a maximum of 64 channels. However, other numbers of stackable boards can be used, e.g., for different numbers of channels.

Potentiostats designed for low current micro-electrode electrochemistry application in both aqueous and non-aqueous solutions need a wider voltage range (>±2 V) and a narrow current measurement range (<±10 uA) [35]. Therefore, in one or more embodiments, the multi-channel potentiostat has an adjustable voltage source of ±4 V and a maximum current of ±1.5 μA.

The potentiostat circuit is split into two main stages: output and input. The output stage consists of three components: a Digital-to-Analog Converter (DAC), a level-shifter, and an analog switch. The DAC used in the proposed design is Microchip Technology MCP4728, which is a quad buffered 12-bit integrated circuit with a built-in high precision internal voltage reference, programmable I2C address, and EEPROM as nonvolatile memory. The DAC interfaces with the base unit via I2C to allow up to four MCP4728, to connect and support various I2C speeds such as Standard (100 kbps), Fast (400 kbps), and High Speed (HS) Mode (3.4 Mbps).

The DAC output is between 0-3.3 V. However, in some examples, the desired output range is ±4 V. The level-shifter is a non-inverted Texas Instruments OPA209, which has Op-amp gain of 2.42 and a 2.8 V bias voltage. It is used to shift and scale the signal from 0-3.3 V to ±4 V. The shifted and scaled output can be calculated as $Vo=2.42*Vin−4$. OPA209 is chosen due to its low power, low noise characteristics, and has a high short-circuit current rating. The MCP4728 has a resolution of 12 bits together with the OPA209 level-shifter result in an output resolution of 1.95 mV One feature that distinguishes the multi-channel potentiostat from other potentiostat designs to date is the ability to disconnect (open-circuit) individual output channels. The ana log switches are added to connect or disconnect individual electrodes, altering electrode configurations automatically. Maxim Integrated MAX326 is a quad CMOS Analog switch, Single Pole Single Throw (SPST), and has ultra-low-leakage. It allows the multi-channel potentiostat to connect or disconnect to the electrode independently. The analog switches have 10 pA maximum leak current and 2 pC typical charge injection. In a low current application, leak current from a switch could unintentionally actuate the electrochemical device making these ultra-low leak characteristics crucial.

The input stage of the multi-channel potentiostat measures the current from an adjustable voltage source that consists of an ammeter and Analog-to-Digital Converter (ADC). Unlike traditional potentiostat designs that use a transimpedance amplifier for current measurements, the multi-channel potentiostat of this example has a shunt resistor. This approach might lower the accuracy but it allows simultaneous recording of multiple voltage sources. For instance, the multi-channel potentiostat with eight channels can operate four independent, two-electrode systems simultaneously, where four standard potentiostats would be required for the same setup. Additionally, the benefits of the multi-channel potentiostat are unlike traditional potentiostats because it can interface with electrochemical cells with three or more electrodes. The system is designed for high impedance load (above 1MO) to measure nA range currents.

The shunt resistors and instrumental op-amps (operational amplifiers) are carefully chosen to minimize the error of the shunt resistor technique. INA121, a low-power instrumental amplifier with ultra-low bias current (4 pA), is used to mitigate measurement errors due to the bias current. The shunt resistor value is 10 k 0.1%, and the instrumental amplifier gain is 100. Consequently, the current to voltage conversion ratio is 1 nA to 1 mV. This design measures the current range from −1,650 to +1,650 nA. The current measurement range is adjusted by changing the value of the gain resistor for the instrumental amplifier, or shunt resistor, or both. Due to the limited range of the ADC, the instrumental amplifier output (−1.65 to +1.65 V) is shifted to match the 0-3.3 V of the ADC input. The output from the instrumental amplifier is fed into the inverted op-amp with an active low-pass filter to minimize noise and level-shifted by 1.65V. The inverted op-amp output is passed through another passive first-order low-pass filter with a cut-off frequency of 72 Hz to reduce the high-frequency noise. The OPA4209 is chosen as an op-amp for both input stages where it offers low voltage noise, quiescent current, offset voltage, and a short-circuit current of 65 mA. ADS1115 is a four single-ended or two differential inputs 16-bit ADC I2C interface with built-in programmable gain (PGA), low-drift voltage reference, and four pin-selectable addresses. This design uses the ADS1115 as four single-ended inputs with a maximum sampling rate of 860 samples per second. As a result, the input stage ranges from −1,650 to +1,650 nA with resolution of 125 uV or 0.125 nA.

The standalone software consists of two main stages: initialization and execution. During the initialization stage, the script initializes all hardware components such as the DAC, ADC, shift-register, and real-time clock. Then, the calibration process starts by switching off analog switches (open-circuit), measuring ADC values during the no-load condition, and averaging the recordings to store as a baseline. After the calibration process, the program shows all pre-defined protocols that are stored in CSV format or comma separated values format and prompt a user input to select which protocol to execute. Once the protocol is selected, the program will run until a user terminates it. In the execution stage, the software displays real-time current measurement values. At the same time, it logs all of the states of the device, such as a timestamp, voltage output of different channels, and current measurement data in CSV format or comma separated values format.

In addition to the predefined protocols that run in standalone mode, the multi-channel potentiostat offers an API where a user can control the multi-channel potentiostat remotely. The multi-channel potentiostat also connects with an external controller via an Ethernet or Wi-Fi connection. Similar to the standalone version, the API has the same initialization process. However, instead of executing a predefined protocol in the execution stage, it is listening for a User Datagram Protocol (UDP) command. The API allows users to set the voltage output of the multi-channel potentiostat and get current measurement feedback. Similar to stand-alone-mode, the multi-channel potentiostat states and output are also logged in CSV file format or comma separated values format. API wrappers are available in both Python3 and Matlab libraries.

The PCBs are designed on a standard 1.6 mm FR4 two-layer PCB with a dimension of 72.5×57 mm (Base) and 71.7×57 mm (Stackable). Both PCBs are manufactured by PCBWay (China); the cost, including shipping is approximately $2 per board. All electronic components are purchased from Digi-Key Electronics (MN, United States). The PCBs are populated and assembled at the University of California at Santa Cruz, shown in FIG. 2. The total cost of the Base unit and Stackable board parts are $70 and $110 respectively.

Example software used includes, but is not limited to, Adafruit_ADS1×15, Marko Pinteric's MCP4728.

Figures 3A, 3B:
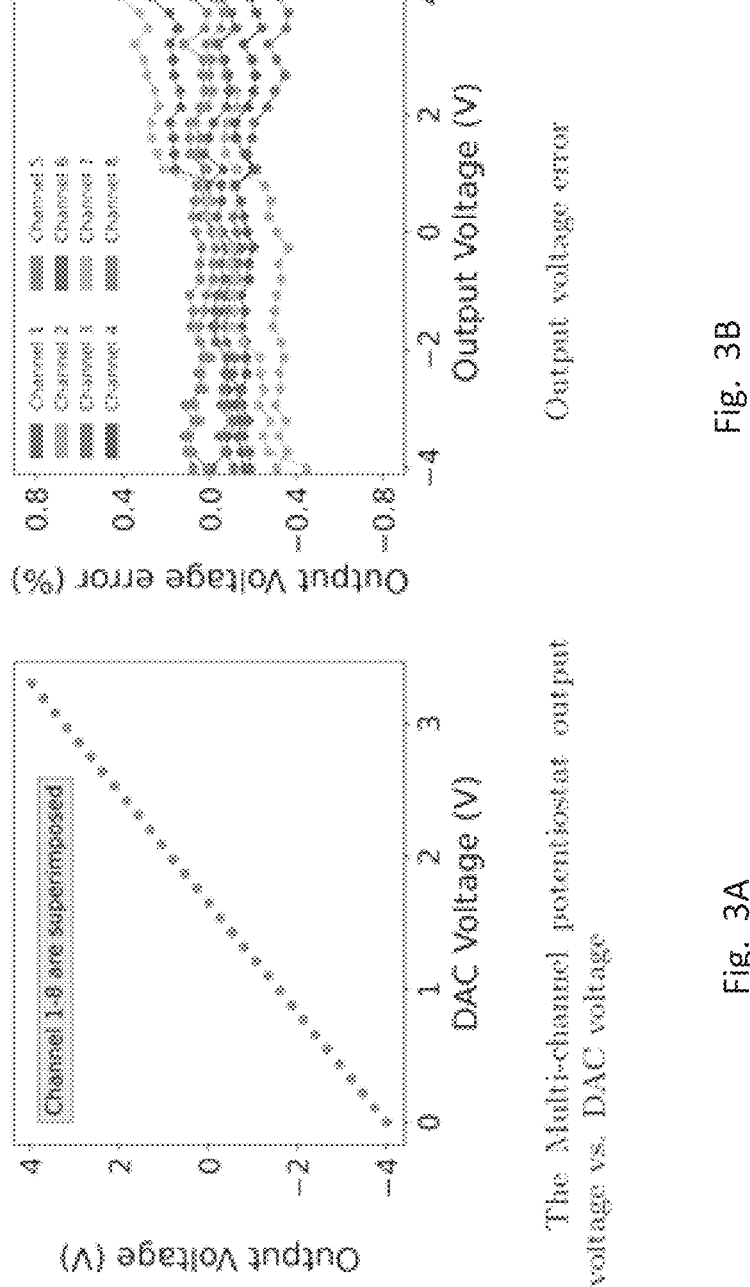
FIGS. 3A-3F. Multi-channel potentiostat characterization tests for channels 1 to 8.
Figures 3C, 3D:
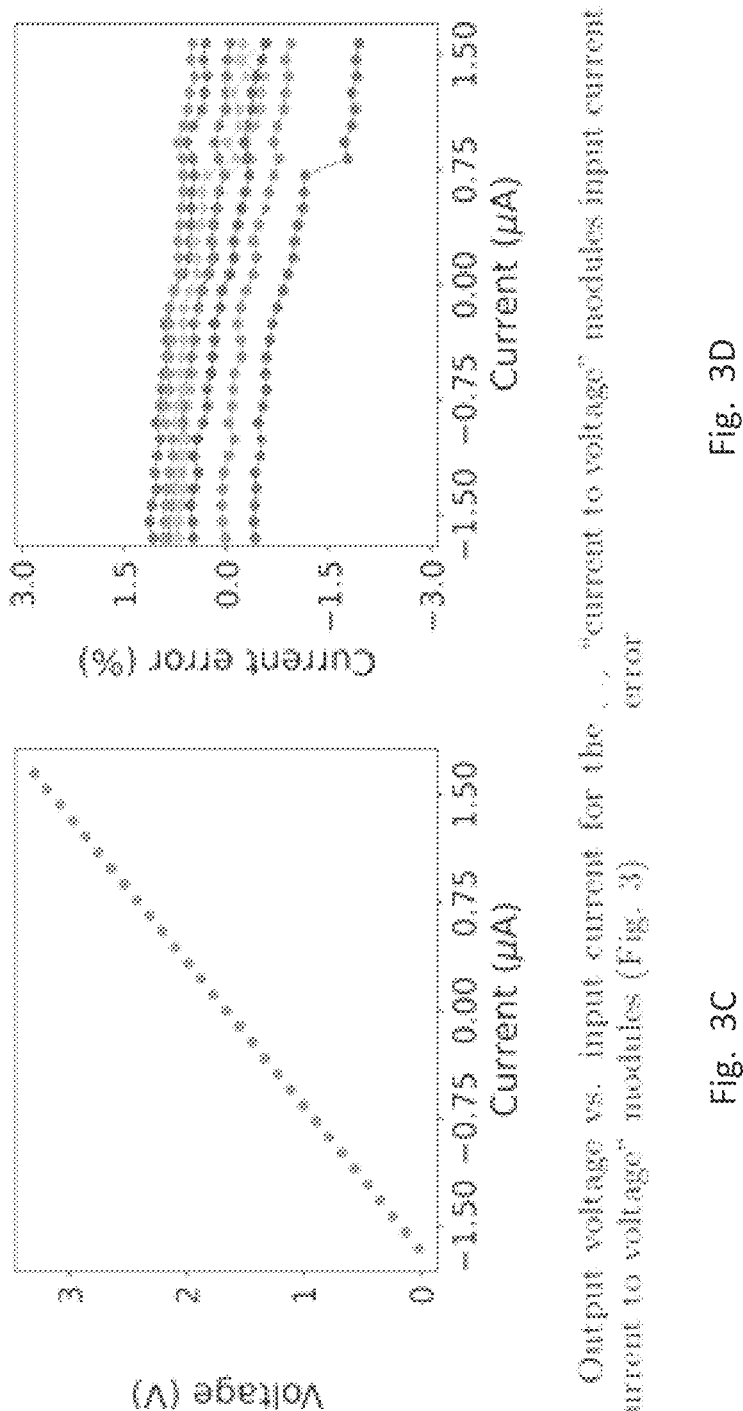
Figures 3E, 3F:
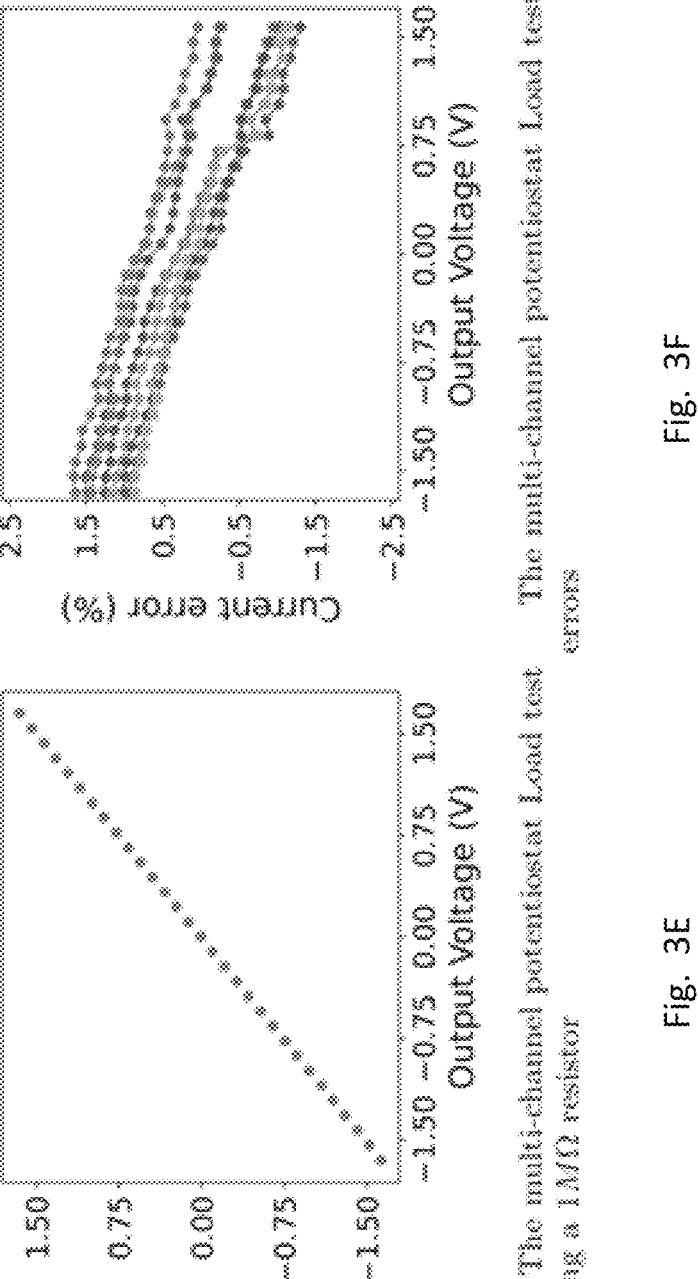
Figure 4:
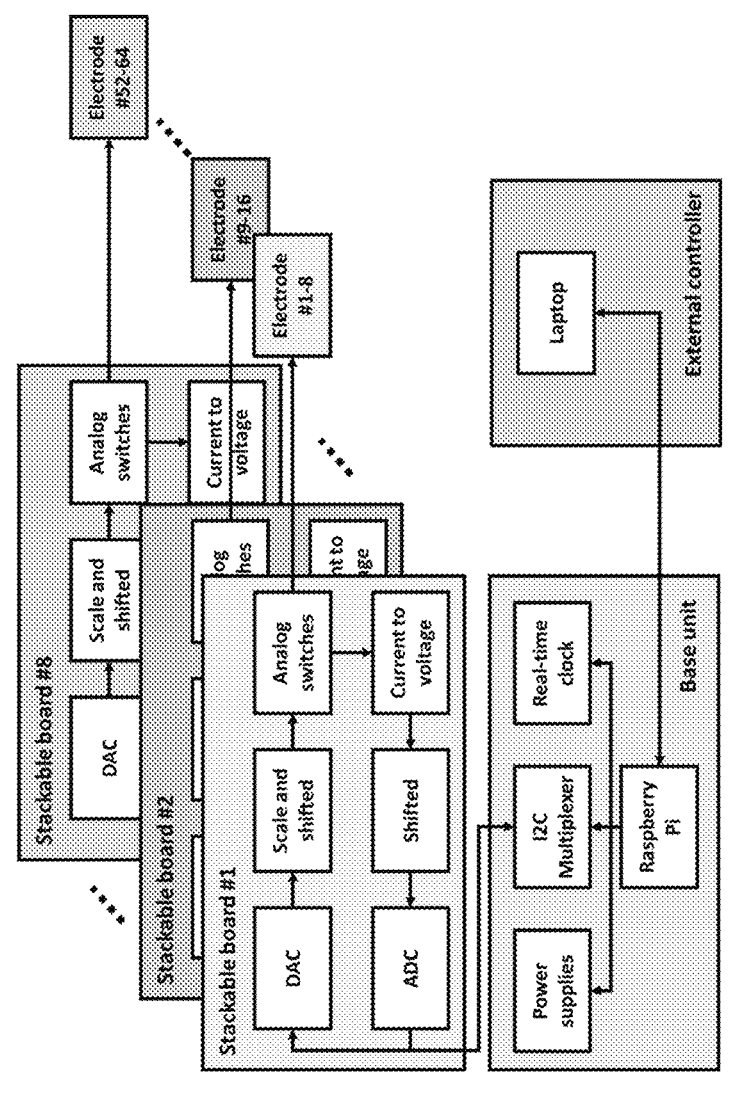
FIG. 4. Multi-channel potentiostat block diagram. The multi-channel potentiostat consists of a base unit and stackable boards. The base unit receives commands from a laptop and provides power and communication to the stackable boards. Each stackable board contains eight independent channels. The multi-channel potentiostat design allows up to eight stackable boards installed simultaneously, resulting in a total of 64 channels. A computer can interface with the multi-channel potentiostat via Ethernet or Wi-Fi.

Example Experimental Characterization of the First Example Device (a) Characterization of the Input and Output Stages of the Multi-Channel Potentiostat As a validation of the device, the linearity of the input and output signals was tested. The performance of 8-channel multi-channel potentiostat under realistic load conditions was also tested. FIGS. 3(*a*) and 3(*b*) shows the measured output voltage as a function of the DAC output voltage and the error of the measured signal from a straight line. The output of the DAC is programmed to sweep between 0 and 3.3V, and it is measured using a digital multimeter. The result shows a linear relationship between the DAC's output and multi-channel potentiostat's output (Equation (1)) with a less than 0.5% full-scale error.

FIGS. 3(*c*) and 3(*d*) show the measured Input Voltage as a function of the current and the error of the measured signal from a straight line. The output of the multi-channel potentiostat is connected to a 1MΩ resistor and sweeps between two voltages to generate a variety of current conditions. A digital multimeter is used to measure the output of an instrumental amplifier and level-shifting op-amp. Similarly, the output test results show the error from linearity (between the current and multi-channel potentiostat's ADC input) is less than 1% of the full-scale.

FIGS. 3(*e*) and 3(*f*) show the performance of the device under a load. The output of the multi-channel potentiostat is connected to a 1MΩ resistor to simulate a high-impedance load. The multi-channel potentiostat's output is programmed to sweep between −1.65 and +1.65 V, and the current is measured using the ADC. It is shown that the current varies linearly with the voltage (between −1.65 μA to +1.65 μA). As additional validation of the system, we calculated the load's resistance as 1.00969 MΩ, compared to 0.997 MΩ when measured with a digital multimeter.

(b) Example Cyclic Voltammetry Validation

The performance of the multi-channel potentiostat system according to the first example during sensitive cyclic-voltammetry (CV) experiments was validated against a commercial system (Autolab PGSTAT128N). For both systems, linear sweep voltammetry tests between −0.9V and 0.5V were performed. FIG. 5(*a*) shows the schematic representation of the experimental setup. The multi-channel potentiostat used a palladium nanoparticle coated gold (Au/PdNP) working electrode (250 μm×250 μm) and an Ag/AgCl pellet counter electrode (2 mm dia.×2 mm thick) in 50 mM NaCl solution (pH 7). The palladium nanoparticle coating is chosen due to palladium's ability to reversibly form palladium hydride by absorbing hydrogen (H) when negatively biased in the presence of water [36]. The experiment was conducted using three different scan speeds, 10, 50, and 100 mV/second. The 100 mV scan rate shows the expected peaks for surface oxide formation (positive peak near 0.15 V), surface oxide reduction (negative peak near −0.2 V), hydrogen adsorption and absorption forming palladium hydride (peak near −0.65 V), and H desorption (positive peak near −0.75) shown in FIG. 5(*d*). The CV sweeps with this system are consistent with the PGSTAT128N over a range from 10 mV/s to 100 mV/s FIGS. 5(*b*)-5(*d*).

The positive peak indicating H desorption is shifted when using the multi-channel potentiostat system by 50 mV. This is explained by the combination of environmental noise and error from the multi-channel potentiostat's output stages. The environment noise can be minimized by better shielding of the potentiostat which includes cables and an electrochemical cell. The output stage of the multi-channel potentiostat can be improved with changing a 12-bit DAC to a DAC with higher resolution such as 16-bit and adding an additional calibration step.

(c) Example Ion Pump Amperometry

Amperometry is a technique used to study redox reactions by providing a direct current (DC) voltage between two electrodes and measuring the generated current. Ion pumps are bioelectronic devices that can manipulate physiological processes in vitro and in vivo delivering ions and small molecules directly to living matters [15, 16]. The devices operate by applying a DC voltage to the electrodes position in a reservoir and a target electrolyte, where ions are driven from the reservoir to the target through an ionic conducting material. FIG. 6(*a*) shows the experimental setup where the ion pump has 1 electrode in the reservoir and 9 individual electrodes in the target.

The multi-channel potentiostat controls the ion pump and records the current with a 15 Hz sampling rate. In contrast, the KEYENCE, BZ-X710 fluorescent microscope images the experiment using a 0.5 Hz recording rate through a GFP filter. The multi-channel potentiostat is connected to nine working electrodes and one counter electrode of the ion pump. It is programmed to generate a square wave with amplitude +1.4 and −1.4V and a period of 30 seconds where it cycles from the first to the ninth electrode. While one electrode is active, the rest of the electrodes are in open-circuit mode. Here, the proton concentration (pH) is measured using fluorescence microscopy simultaneously while the voltage is swept. The target well is filled with pH sensitive fluorescent dye (SNARF1-1). In this process, each proton that moves from the reservoir to a certain electrode in the target results in an electron collected in the corresponding circuit channel.

Figures 6A, 6B:
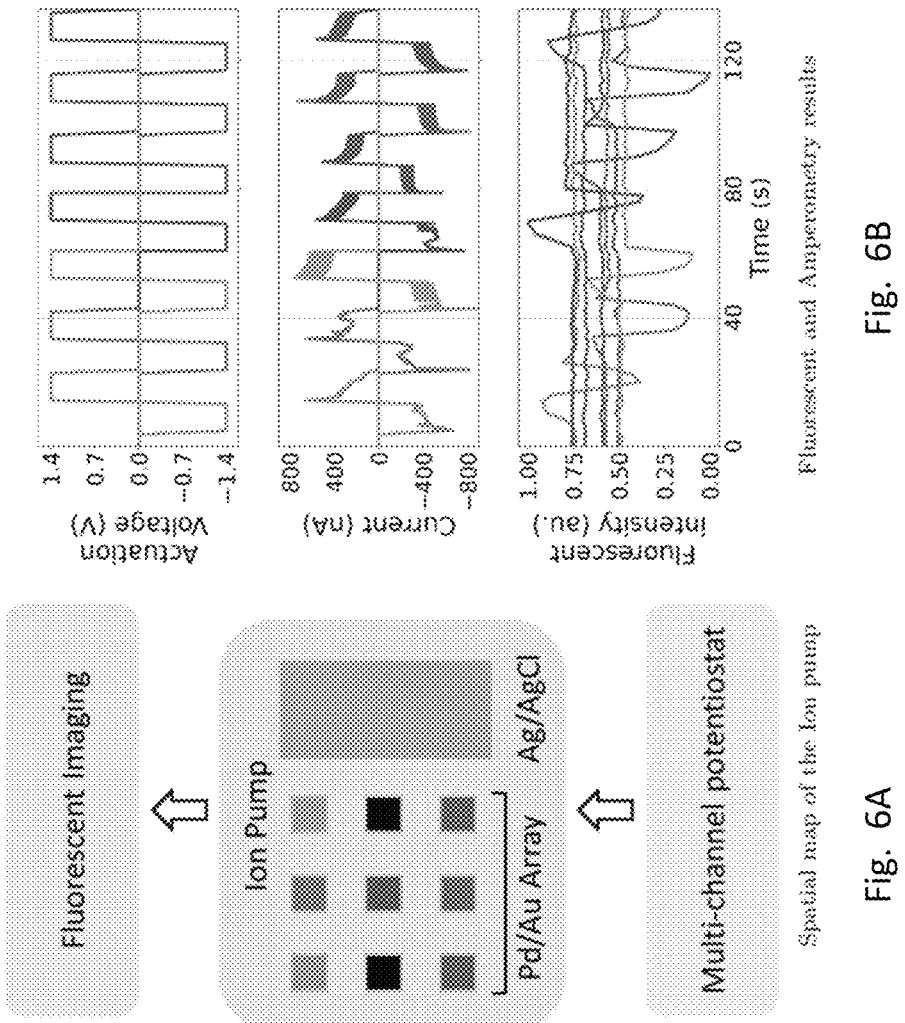
FIGS. 6A-6B.

FIG. 6B shows the fluorescence intensity sampled from each electrode, which increases with fewer protons in the solution. By applying a negative voltage, the ion pump moves protons from the target to the reservoir resulting in higher fluorescence intensity and vice versa. The current profiles synchronizing with the changes of fluorescence intensity in FIG. 6B indicates that the multi-channel potentiostat can run amperometry experiments and provide reliable current data. This experiment does not use electrodes 4 and 6 of the ion pump. Overall, the amperometry results show good agreement with the actuation voltage and the fluorescence results.

Example Closed-Loop Control

In many applications [37], instead of applying a predefined voltage (wave) in an open-loop fashion, the system needs to interact with the environment in real-time closed-loop form through feedback. To this end, there is a need for a versatile multi-channel potentiostat that allows control through custom algorithms. With the provided API, an external controller can remotely control the multi-channel potentiostat.

Figure 7:
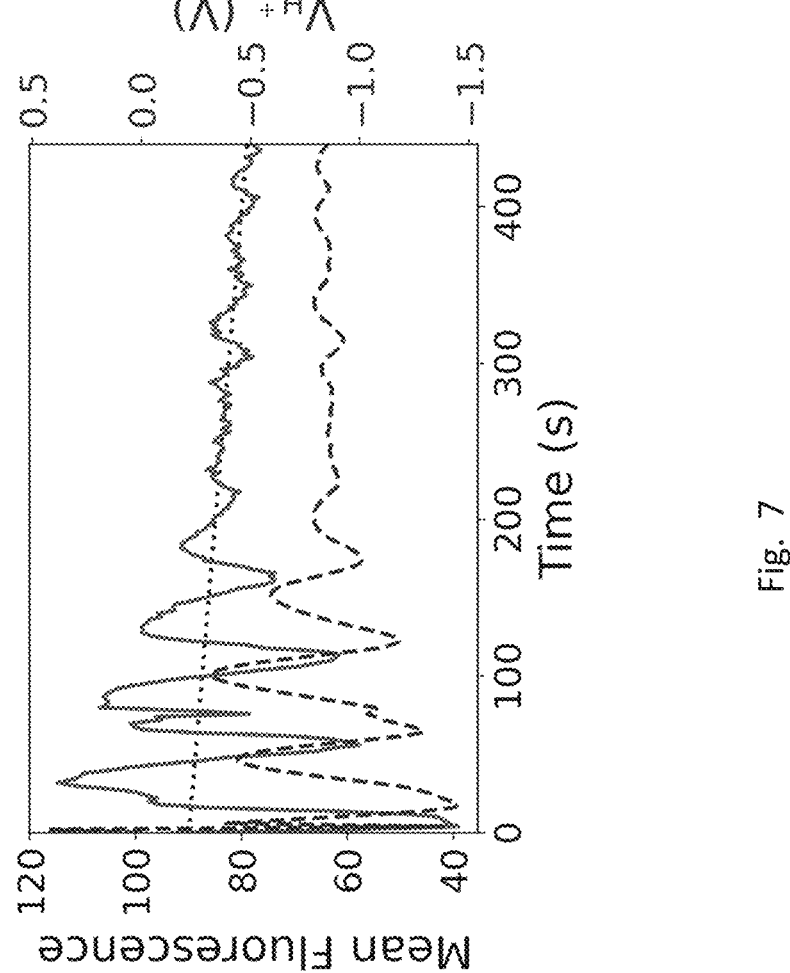
FIG. 7. Closed-loop control black line: Target; red line: Fluoresce respond; and blue: Controller output.

A closed-loop feedback control experiment is further detailed in [34]. In this work, Jafari et al [34] demonstrated a use-case utilizing the same ion pump device and monitoring the changes in the ion concentration using fluorescent microscope imaging. However, instead of a predefined square wave, a multi-channel potentiostat's output is generated using a higher lever control algorithm written as a Matlab script (external controller) running on a remote laptop. The Matlab script is running a machine learning-based control algorithm, in which the goal is to keep H+ ion concentration (fluorescent intensity) at a target value. The algorithm reads fluorescent images in real-time to further analyze and compute the mean value of the selected target area which is inversely proportional to the ion concentration. This value is fed into the machine learning-based control algorithm to generate the appropriate output and remotely send it to a multi-channel potentiostat to maintain the H+ ion concentration value to follow the desired target. The result shows that the control algorithm can successfully keep H+ ion concentration at the target function which shown in FIG. 7 which further demonstrates the seamless flexibility of a multi-channel potentiostat. It also allows an interface with an external controller running on a different machine.

Advantages and Improvements

Due to the high cost and limited access to quality components, access to quality potentiostats is usually limited, especially in developing countries [8]. As a result, a potentiostat is a significant bottleneck in the process of developing and testing electrochemical devices [9].

Portability is a major obstacle in testing small, wearable devices. For instance, large and expensive bench-top potentiostats are not feasible options for operating wearable glucose sensors [10]. Cumyn et al [11] and Li et al [12] proposed two multi-channel potentiostats that consist of interconnected independent pieces of off-the-shelf lab equipment. Consequently, the cost per channel would be relatively high, and the potentiostats would lack portability. As electrochemical devices become more sophisticated and diverse, the number of electrodes and their operating range increases. For instance, the emerging trend of sensor arrays such as Gao et al [13], Zao et al [3], and Xu et al [14] sweat sensor arrays have more than five electrodes.

Selberg et al [15] and Jia et al [16] proposed bioelectronic actuators have as many as 24 electrodes and require an actuation range of 0-3 V. Turner et al [17], Kakerow et al [18], Stanacevic et al [19], Ayers et al [20], and Martin et al [21] proposed low-level VLSI (CMOS/single Chip design) single-channel potentiostats. Although they are more affordable and smaller, they are difficult to replicate. Therefore, there are other approaches that utilize commercial off-the-shelf components. For instance, Meloni [22], Li et al [23], proposed single-channel potentiostats, Jenkins et al [24] and Ainla et al [25] proposed wireless systems, and Glasscott et al [26] designed a Lab-view controlled device for low-current applications. Rowe et al [8] proposed a high-level circuit board design of a portable less expensive potentiostat (less than $200) that supports various electroanalysis methods (i.e., cyclic, square wave, linear sweep, and stripping voltammetry) over the voltage range of −0.99 to +0.99V. Friedman et al [27], Dryden et al [28], Cruz et al [9], Hoilett et al [29], and Adams et al [7] proposed similar devices with smaller form-factor. Dobbelaere et al [30] potentiostat design can reach up to 8V where most of the affordable solutions output a range less than 1 V. Commercial potentiostats [31-33] are significantly more expensive, and not all of them support multiple electrode setup (e.g., [31]). Although some of the potentiostats support up to three electrodes, none of them simultaneously address portability, high number of channels, high number of electrodes, wide output range, and low-cost, as can be achieved using embodiments of the present invention.

Table 1 in FIG. 8 shows a comparison between a system according to embodiments described herein, research-grade potentiostats, and commercial-grade potentiostats. The results presented herein have proven that one or more embodiments of the device described herein are scalable, portable, significantly cheaper than commercially available systems with similar characteristics, and can be controlled remotely. Therefore exemplary devices could be used as a component in settings that need to be operated remotely.

Example Hardware Environment

Figure 9:
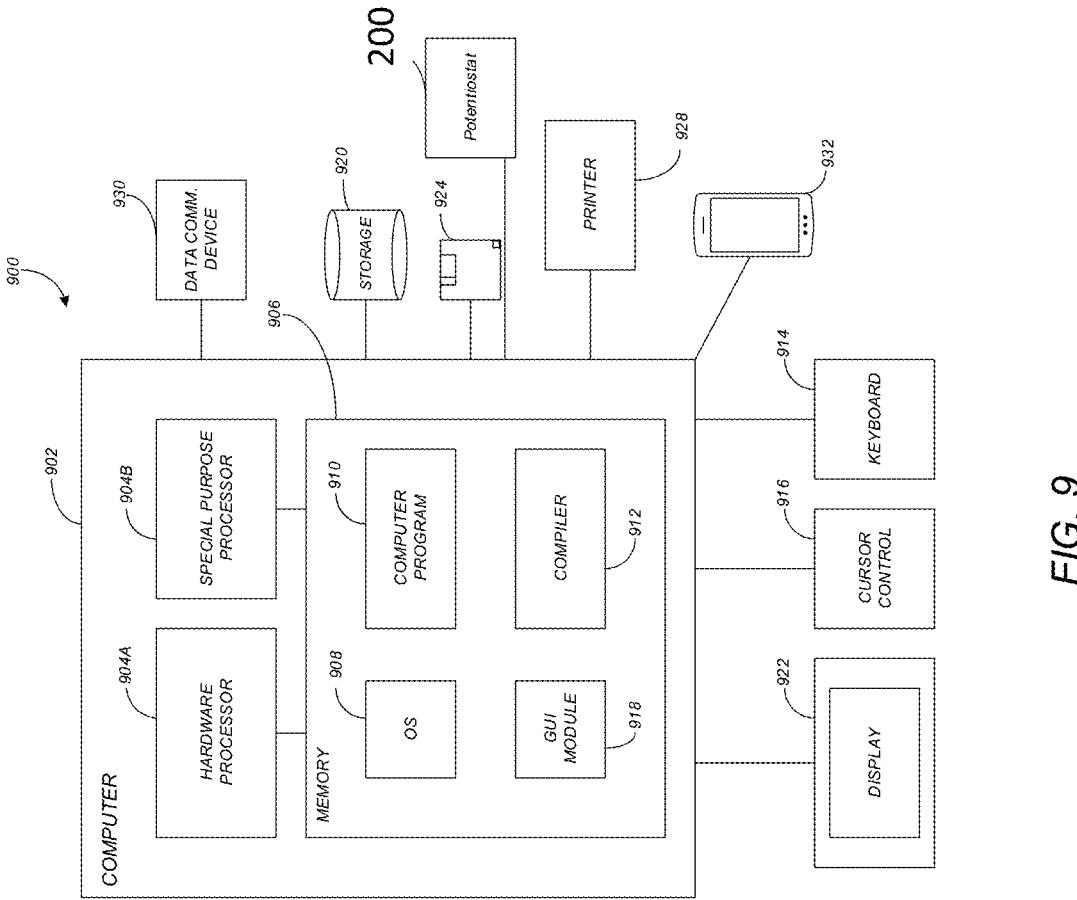
FIG. 9. Hardware environment for implementing one or more embodiments of the present invention.

FIG. 9 is an exemplary hardware and software environment 900 (referred to as a computer-implemented system and/or computer-implemented method) used to implement one or more embodiments of the invention (e.g., control and/or read out results of the multi-channel potentiostat 200). The hardware and software environment includes a computer 902 and may include peripherals. Computer 902 may be a user/client computer, server computer, or may be a database computer. The computer 902 comprises a hardware processor 904A and/or a special purpose hardware processor 904B (hereinafter alternatively collectively referred to as processor 904) and a memory 906, such as random access memory (RAM). The computer 902 may be coupled to, and/or integrated with, other devices, including input/output (I/O) devices such as a keyboard 914, a cursor control device 916 (e.g., a mouse, a pointing device, pen and tablet, touch screen, multi-touch device, etc.) and a printer 928. In one or more embodiments, computer 902 may be coupled to, or may comprise, a portable or media viewing/listening device 932 (e.g., an MP3 player, IPOD, NOOK, portable digital video player, cellular device, personal digital assistant, etc.). In yet another embodiment, the computer 902 may comprise a multi-touch device, mobile phone, gaming system, internet enabled television, television set top box, or other internet enabled device executing on various platforms and operating systems.

In one embodiment, the computer 902 operates by the hardware processor 904A performing instructions defined by the computer program 910 (e.g., controlling potentiostat) under control of an operating system 908. The computer program 910 and/or the operating system 908 may be stored in the memory 906 and may interface with the user and/or other devices to accept input and commands and, based on such input and commands and the instructions defined by the computer program 910 and operating system 908, to provide output and results.

Output/results may be presented on the display 922 or provided to another device for presentation or further processing or action. In one embodiment, the display 922 comprises a liquid crystal display (LCD) having a plurality of separately addressable liquid crystals. Alternatively, the display 922 may comprise a light emitting diode (LED) display having clusters of red, green and blue diodes driven together to form full-color pixels. Each liquid crystal or pixel of the display 922 changes to an opaque or translucent state to form a part of the image on the display in response to the data or information generated by the processor 904 from the application of the instructions of the computer program 910 and/or operating system 908 to the input and commands. The image may be provided through a graphical user interface (GUI) module 918. Although the GUI module 918 is depicted as a separate module, the instructions performing the GUI functions can be resident or distributed in the operating system 908, the computer program 910, or implemented with special purpose memory and processors.

In one or more embodiments, the display 922 is integrated with/into the computer 902 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 902 according to the computer program 910 instructions may be implemented in a special purpose processor 904B. In this embodiment, some or all of the computer program 910 instructions may be implemented via firmware instructions stored in a read only memory (ROM), a programmable read only memory (PROM) or flash memory within the special purpose processor 904B or in memory 906. The special purpose processor 904B may also be hardwired through circuit design to perform some or all of the operations to implement the present invention. Further, the special purpose processor 904B may be a hybrid processor, which includes dedicated circuitry for performing a subset of functions, and other circuits for performing more general functions such as responding to computer program 910 instructions. In one embodiment, the special purpose processor 904B is an application specific integrated circuit (ASIC) or a field programmable gate array.

The computer 902 may also implement a compiler 912 that allows an application or computer program 910 written in a programming language such as C, C++, Assembly, SQL, PYTHON, PROLOG, MATLAB, RUBY, RAILS, HASKELL, or other language to be translated into processor 904 readable code. Alternatively, the compiler 912 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 910 accesses and manipulates data accepted from I/O devices and stored in the memory 906 of the computer 902 using the relationships and logic that were generated using the compiler The computer 902 also optionally comprises an external communication device such as a modem, satellite link, Ethernet card, or other device for accepting input from, and providing output to, other computers 902.

In one embodiment, instructions implementing the operating system 908, the computer program 910, and the compiler 912 are tangibly embodied in a non-transitory computer-readable medium, e.g., data storage device 920, which could include one or more fixed or removable data storage devices, such as a zip drive, floppy disc drive 924, hard drive, CD-ROM drive, tape drive, etc. Further, the operating system 908 and the computer program 910 are comprised of computer program 910 instructions which, when accessed, read and executed by the computer 902, cause the computer 902 to perform the steps necessary to implement and/or use the present invention or to load the program of instructions into a memory 906, thus creating a special purpose data structure causing the computer 902 to operate as a specially programmed computer executing the method steps described herein. Computer program 910 and/or operating instructions may also be tangibly embodied in memory 906 and/or data communications devices 930, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 902.

Figure 10:
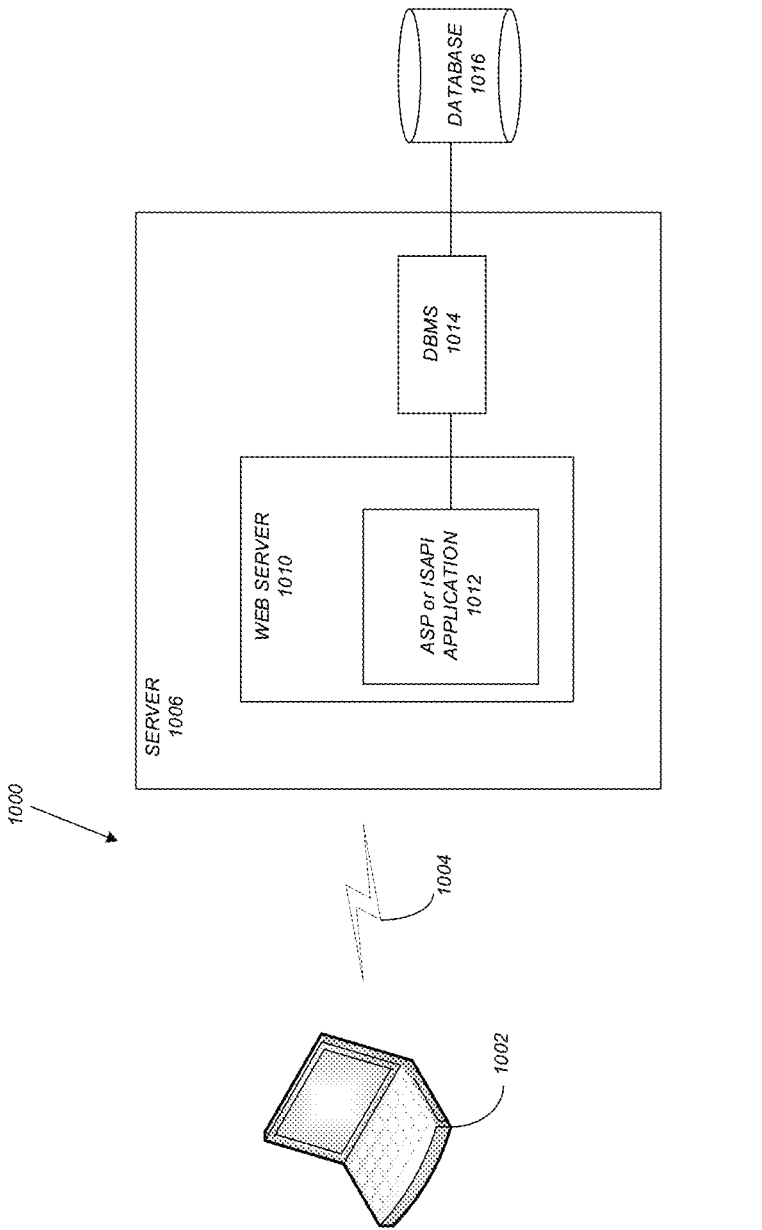
FIG. 10. Network environment for implementing one or more embodiments of the present invention.

FIG. 10 schematically illustrates a typical distributed/cloud-based computer system 1000 using a network 1004 to connect client computers 1002 to server computers 1006. A typical combination of resources may include a network 1004 comprising the Internet, LANs (local area networks), WANs (wide area networks), SNA (systems network architecture) networks, or the like, clients 1002 that are personal computers or workstations (as set forth in FIG. 9), and servers 1006 that are personal computers, workstations, minicomputers, or mainframes (as set forth in FIG. 9). However, it may be noted that different networks such as a cellular network (e.g., GSM [global system for mobile communications] or otherwise), a satellite based network, or any other type of network may be used to connect clients 1002 and servers 1006 in accordance with embodiments of the invention.

A network 1004 such as the Internet connects clients 1002 to server computers 1006. Network 1004 may utilize ethernet, coaxial cable, wireless communications, radio frequency (RF), etc. to connect and provide the communication between clients 1002 and servers 1006. Further, in a cloud-based computing system, resources (e.g., storage, processors, applications, memory, infrastructure, etc.) in clients 1002 and server computers 1006 may be shared by clients 1002, server computers 1006, and users across one or more networks. Resources may be shared by multiple users and can be dynamically reallocated per demand. In this regard, cloud computing may be referred to as a model for enabling access to a shared pool of configurable computing resources.

Clients 1002 may execute a client application or web browser and communicate with server computers 1006 executing web servers 1010. Such a web browser is typically a program such as MICROSOFT INTERNET EXPLORER/EDGE, MOZILLA FIREFOX, OPERA, APPLE SAFARI, GOOGLE CHROME, etc. Further, the software executing on clients 1002 may be downloaded from server computer 1006 to client computers 1002 and installed as a plug-in or ACTIVEX control of a web browser. Accordingly, clients 1002 may utilize ACTIVEX components/component object model (COM) or distributed COM (DCOM) components to provide a user interface on a display of client 1002. The web server 1010 is typically a program such as MICROSOFT'S INTERNET INFORMATION SERVER.

Web server 1010 may host an Active Server Page (ASP) or Internet Server Application Programming Interface (ISAPI) application 1012, which may be executing scripts.

The scripts invoke objects that execute business logic (referred to as business objects). The business objects then manipulate data in database 1016 through a database management system (DBMS) 1014. Alternatively, database 1016 may be part of, or connected directly to, client 1002 instead of communicating/obtaining the information from database 1016 across network 1004. When a developer encapsulates the business functionality into objects, the system may be referred to as a component object model (COM) system. Accordingly, the scripts executing on web server 1010 (and/or application 1012) invoke COM objects that implement the business logic. Further, server 1006 may utilize MICROSOFT'S TRANSACTION SERVER (MTS) to access required data stored in database 1016 via an interface such as ADO (Active Data Objects), OLE DB (Object Linking and Embedding DataBase), or ODBC (Open Data-Base Connectivity).

Generally, these components 1000-1016 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 1002 and 1006 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1002 and 1006. Embodiments of the invention are implemented as a software application on a client 1002 or server computer 1006. Further, as described above, the client 1002 or server computer 1006 may comprise a thin client device or a portable device that has a multi-touch-based display.

Example software used includes, but is not limited to, Adafruit_ADS1×15, Marko Pinteric's MCP4728.

Device and System Embodiments

Illustrative embodiments of the inventive subject matter include, but are not limited to, the following.

1. A modular, multi-channel potentiostat 200, comprising:
a base printed circuit board 202;
a power supply 204; a multiplexer 206; a clock 208; and a computer 210 mounted on and electrically connected to the base printed circuit board 202; and
one or more modules each comprising a stackable printed circuit board 212, wherein the module comprises a potentiostat circuit 214 electrically connectable to the base printed circuit board 202, wherein the potentiostat circuits 214 each control a voltage between two or more electrodes 502 in an electrochemical cell 500; and
a mount 218 capable of attaching a plurality of the stackable printed circuit boards 212 to the base circuit board 202;
so that the potentiostat can be configured for controlling a selected plurality of channels each applying one of the voltages and receiving a response from one or more of a selected number of the electrodes 216.

2. The potentiostat of example 1, wherein each of the potentiostat circuits 214 comprise:
one or more switches 219 for electrically connecting or disconnecting to the electrodes;
an output stage comprising a digital to analog converter (DAC) circuit 220 and a first level shifter circuit 222, wherein the first level shifter circuit 222 is electrically connected to one or more of the switches 219 and the DAC circuit 220 is electrically connectable or connected to the multiplexer 206 (e.g., via connector pins and/or conductive tracks); and
an input stage comprising a current to voltage converter circuit 224 electrically connected to one or more of the switches 219; a second level shifter circuit 226 connected to an output of the current to voltage converter 224 circuit; and an analog to digital converter circuit 228 connected to an output of the second level shifter circuit 226, wherein the ADC circuit 228 is electrically connectable/connected to the multiplexer 206 (e.g., via conductive tracks and/or connector pins).

3. The potentiostat of example 2; wherein:
the first level shifter circuit 222 scales and/or shifts a DAC voltage output from the DAC circuit 220 to the voltage comprising a desired level applied between the electrodes 502; and
the second level shifter circuit 226 scales and/or shifts a voltage output from the current to voltage converter circuit 224 into an acceptable range for input to the ADC circuit 228.

4. The potentiostat of example 2 or 3, wherein the current to voltage converter circuit 224 comprises a shunt resistor connected to an amplifier.

5. The potentiostat of any of the examples 1-4 connected to between 8 and 64 of the electrodes 502 and further comprising a plurality of the stackable boards 212, each of the stackable boards 212 connected to a subset of the electrodes 502 so as to control the voltage applied to the subset of the electrodes 502.

6. The potentiostat of any of the examples 1-5, wherein each of the stackable boards 212 simultaneously control the voltage applied to the electrodes 502 comprising between 1-8 electrodes 502 (e.g. one or more two electrode systems).

7. The potentiostat of any of the examples 1-6, wherein the switches 219 connect or disconnect to the electrodes 502 independently.

8. The potentiostat of any of the examples 1-7, wherein the computer 210, 900 comprises one or more processors 904A, 904B; one or more memories; and one or more applications 910 stored in the one or more memories, wherein the application executed by the one or more processors:
initializes the DAC circuit 229, the ADC circuit 228, shift-register 230, and the clock 208;
calibrates the potentiostat 200, comprising:
electrically disconnecting the switches 219 from the electrodes 502 and measuring ADC output voltages outputted from the ADC circuit 228 during a no-load (open circuit) condition so as to obtain measurement recordings; and
averaging the measurement recordings to obtain a baseline;
executes a measurement protocol selected by a user, comprising obtaining real-time current measurement values in response to the voltages applied to a sample via the electrodes 502.

9. The potentiostat of any of the examples 1-8, wherein the computer 210 comprises one or more processors 904A, 904B; one or more memories; and one or more applications 910 stored in the one or more memories, wherein one or more of the applications 910 executed by one or more of the processors implement an Application Program Interface (API) allowing a user to control the potentiostat 200 remotely from a remote computer 1006 via a wireless or wired connection to the computer 210, 900.

10. The potentiostat of example 9, wherein the API enables the user, via the remote computer 1006, to configure and set the voltages applied to the electrodes 502 and receive the current measurements outputted from the electrodes 502 in response to the voltages.

11. The potentiostat of any of the examples 8-10, wherein one or more of the applications log timestamps, voltage output of the different electrodes 502, and current measurements in comma separated values format.

12. The potentiostat of any of the examples 8-11, wherein the one or more applications 910 execute a machine learning algorithm controlling the voltages or analyzing data obtained using the potentiostat.

13. The potentiostat of any of the examples 1-12, wherein the computer 210, 900 comprises a single board computer.

14. The potentiostat of any of the examples 1-12, wherein the computer 210, 900 comprises a Raspberry Pi computer.

15. The potentiostat of any of the examples 1-12, wherein the computer 210, 900 comprises an Application Specific Integrated Circuit or a Field Programmable Gate Array.

16. The potentiostat of any of the examples 2-15, wherein the current to voltage converter circuit receives 224, via one or more of the switches 219, one or more currents outputted from one or more of the electrodes 502 in response to one or more voltages outputted from the first level shifter 222 and applied to one or more of the electrodes 502 via one or more of the switches 219.

17. The potentiostat of example 16, wherein the electrodes 502 are in an electrochemical cell.

18. The potentiostat of any of the examples 2-17, wherein the switches 219 independently connect or disconnect to the electrodes 502 so as to apply the voltages, adjustable in a range of ±4 V, and receive a maximum currents in a range ±1.5 µA, wherein the voltages and maximum currents are independently adjustable for each electrode or pair of electrodes 502.

19. The potentiostat of any of the examples 1-18, wherein the switches 219 comprise analog switches.

20. An analyte sensor comprising the potentiostat of any of the examples 1-19, wherein one or more of the electrodes 502 are in contact with the analyte and the voltages are applied so as to sense the analyte.

21. The potentiostat of any of the examples 1-20, wherein each of the boards 212, 202 has a length less than 100 millimeters and a width less than 100 millimeters (or a surface area less than 100 mm by 100 mm).

22. An imaging system 100 connected to the potentiostat 200 of any of the examples 1-22 obtaining amperometric data using the voltages applied to the electrodes 502, wherein the imaging system correlates fluorescence of the sample with amperometric data.

23. The potentiostat of any of the examples 1-22, wherein the potentiostat is dimensioned and configured so as to be portable or carried by hand.

24. The potentiostat of any of the examples, wherein the clock 208 controls timing of the voltages applied to the electrodes and receipt at the electrodes 502 of the response to the voltages.

25. The potentiostat of any of the examples 1-43, wherein the multiplexer 206 is configured to control the voltages applied in the selected number of channels to the selected number of electrodes 502 and the power supply provides the power required to supply all the voltages.

26. A method of making a modular, multi-channel potentiostat, comprising:

mounting or attaching a power supply; a multiplexer; a clock; and a computer mounted on and electrically connected to the base printed circuit board; and fabricating and mounting one or more modules each comprising a stackable printed circuit board, wherein module comprises a potentiostat circuit connected to the base printed circuit board, wherein the potentiostat circuits each control a voltage between two or more electrodes in an electrochemical cell; wherein the stackable printed circuit boards are mounted to the base circuit board;

so that the potentiostat can be configured for controlling a selected plurality of channels each applying one of the voltages and receiving a response from one or more of a selected number of the electrodes.

27. The system or potentiostat of any of the examples manufactured using the method of example 26.

28. The system or potentiostat of any of the examples configured to control and/or receive outputs from a battery, glucose sensor, analyte sensor, breathalyzer, or microscope.

REFERENCES

The following references are incorporated by reference herein.

1. Nitta N, Wu F, Lee J T, Yushin G. Li-ion battery materials: present and future. Materials today. 2015; 18 (5):252-264. https://doi.org/10.1016/j.mattod.2014.10.040

2. Strakosas X, Selberg J, Pansodtee P, Yonas N, Manapongpun P, Teodorescu M, et al. A non-enzymatic glucose sensor enabled by bioelectronic pH control. Scientific reports. 2019; 9(1):1-7. https://doi.org/10.1038/s41598-019-46302-9 PMID: 31350439

3. Zhao Y, Wang B, Hojaiji H, Wang Z, Lin S, Yeung C, et al. A wearable freestanding electrochemical sensing system. Science Advances. 2020; 6(12). https://doi.org/10.1126/sciadv.aaz0007 PMID: 32219164

4. Bihar E, Deng Y, Miyake T, Saadaoui M, Malliaras G G, Rolandi M. A Disposable paper breathalyzer with an alcohol sensing organic electrochemical transistor. Scientific reports. 2016; 6:27582. https://doi.org/10.1038/srep27582 PMID: 27291059

5. Abdulbari H A, Basheer E A. Electrochemical biosensors: electrode development, materials, design, and fabrication. ChemBioEng Reviews. 2017; 4(2):92-105. https://doi.org/10.1002/cben.201600009

6. Gopinath A V, Russell D. An inexpensive field-portable programmable potentiostat. Chem Educ. 2005; 10:1-6.

7. Adams S D, Doeven E H, Quayle K, Kouzani A Z. MiniStat: Development and evaluation of a mini-potentiostat for electrochemical measurements. IEEE Access. 2019; 7:31903-31912.

8. Rowe A A, Bonham A J, White R J, Zimmer M P, Yadgar R J, Hobza T M, et al. CheapStat: an open-source, "Do-It-Yourself" potentiostat for analytical and educational applications. PloS one. 2011; 6(9). https://doi.org/10.1371/journal.pone.0023783 PMID: 21931613

9. Cruz A F D, Norena N, Kaushik A, Bhansali S. A low-cost miniaturized potentiostat for point-of-care diagnosis. Biosensors and Bioelectronics. 2014; 62:249-254. https://doi.org/10.1016/j.bios.2014.06.053 PMID: 25016332

10. Adams S, Buber E, Bicak T, Yagci Y, Toppare L, Kaynak A, et al. A miniature and low-cost glucose measurement system. Biocybernetics and Biomedical Engineering. 2018; 38(4):841-849. https://doi. org/10.1016/j.bbe.2018.07.004

11. Cumyn V K, Fleischauer M, Hatchard T, Dahn J R. Design and testing of a low-cost multichannel pseudopotentiostat for quantitative combinatorial electrochemical measurements on large electrode arrays. Electrochemical and Solid-State Letters. 2003; 6(6):E15-E18. https://doi.org/10.1149/1.1570031

12. Li H, Luo X, Liu C, Jiang L, Cui D, Cai X, et al. Multi-channel electrochemical detection system based on LabVIEW. In: International Conference on Information Acquisition, 2004. Proceedings. IEEE; 2004.p. 224-227.

13. Gao W, Emaminejad S, Nyein H Y Y, Challa S, Chen K, Peck A, et al. Fully integrated wearable sensor arrays for multiplexed in situ perspiration analysis. Nature. 2016; 529(7587):509-514. https://doi.org/10.1038/nature16521 PMID: 26819044

14. Xu G, Cheng C, Liu Z, Yuan W, Wu X, Lu Y, et al. Battery-Free and Wireless Epidermal Electrochemical System with All-Printed Stretchable Electrode Array for Multiplexed In Situ Sweat Analysis. Advanced Materials Technologies. 2019; 4(7):1800658. https://doi.org/10.1002/admt.201800658

15. Selberg J, Jafari M, Mathews J, Jia M, Pansodtee P, Dechiraju H, et al. Machine Learning-Driven Bioelectronics for Closed-Loop Control of Cells. Advanced Intelligent Systems; n/a(n/a):2000140. https://doi.org/10.1002/aisy.202000140

16. Jia M, Dechiruji H, Selberg J, Pansodtee P, Mathews J, Wu C, et al. Bioelectronic control of chloride ions and concentration with Ag/AgCl contacts. APL Materials. 2020; 8(9):091106. https://doi.org/10.1063/5.0013867

17. Turner R F, Harrison D J, Baltes H P. A CMOS potentiostat for amperometric chemical sensors. IEEE Journal of Solid-State Circuits. 1987; 22(3):473-478. https://doi.org/10.1109/JSSC.1987.1052753

18. Kakerow R G, Kappert H, Spiegel E, Manoli Y. Low-power single-chip CMOS potentiostat. In: Proceedings of the International Solid-State Sensors and Actuators Conference-TRANSDUCERS'95. vol. 1. IEEE; 1995. p. 142-145.

19. Stanacevic M, Murari K, Rege A, Cauwenberghs G, Thakor N V. VLSI potentiostat array with oversampling gain modulation for wide-range neurotransmitter sensing. IEEE Transactions on Biomedical Circuits and Systems. 2007; 1(1):63-72. https://doi.org/10.1109/TBCAS.2007.893176 PMID: 23851522

20. Ayers S, Gillis K D, Lindau M, Minch B A. Design of a CMOS potentiostat circuit for electrochemical detector arrays. IEEE Transactions on Circuits and Systems I: Regular Papers. 2007; 54(4):736-744. https://doi.org/10.1109/TCSI.2006.888777 PMID: 20514150

21. Martin S M, Gebara F H, Strong T D, Brown R B. A fully differential potentiostat. IEEE Sensors Journal. 2009; 9(2):135-142. https://doi.org/10.1109/JSEN.2008.201108

22. Meloni G N. Building a microcontroller based potentiostat: A inexpensive and versatile platform for teaching electrochemistry and instrumentation; 2016.

23. Li Y C, Melenbrink E L, Cordonier G J, Boggs C, Khan A, Isaac M K, et al. An easily fabricated low-cost potentiostat coupled with user-friendly software for introducing students to electrochemical reactions and electroanalytical techniques; 2018.

24. Jenkins D M, Lee B E, Jun S, Reyes-De-Corcuera J, McLamore E S. ABE-Stat, a fully open-source and versatile wireless potentiostat project including electrochemical impedance spectroscopy. Journal of The Electrochemical Society. 2019; 166(9):B3056. https://doi.org/10.1149/2.0061909jes 25. Ainla A, Mousavi M P, Tsaloglou M N, Redston J, Bell J G, Ferna'ndez-Abedul M T, et al. Open-source potentiostat for wireless electrochemical detection with smartphones. Analytical chemistry. 2018; 90 (10):6240-6246. https://doi.org/10.1021/acs.analchem.8b00850 PMID: 29658268

26. Glasscott M W, Verber M D, Hall J R, Pendergast A D, McKinney C J, Dick J E. SweepStat: A Build-It-Yourself,y Two-Electrode Potentiostat for Macroelectrode and Ultramicroelectrode Studies; 2019.

27. Friedman E S, Rosenbaum M A, Lee A W, Lipson D A, Land B R, Angenent L T. A cost-effective and field-ready potentiostat that poises subsurface electrodes to monitor bacterial respiration. Biosensors and Bioelectronics. 2012; 32(1):309-313. https://doi.org/10.1016/j.bios.2011.12.013 PMID: 22209069.

28. Dryden M D, Wheeler A R. DStat: A versatile, open-source potentiostat for electroanalysis and integration. PloS one. 2015; 10(10):e0140349. https://doi.org/10.1371/journal.pone.0140349 PMID: 26510100

29. Hoilett O S, Walker J F, Balash B M, Jaras N J, Boppana S, Linnes J C. KickStat: A Coin-Sized Potentiostat for High-Resolution Electrochemical Analysis. Sensors. 2020; 20(8):2407. https://doi.org/10.3390/s20082407 PMID: 32340294

30. Dobbelaere T, Vereecken P M, Detavernier C. A USB-controlled potentiostat/galvanostat for thin-film battery characterization. HardwareX. 2017; 2:34-49. https://doi.org/10.1016/j.ohx.2017.08.001

31. BV P. Emstat 3—hardware specification; 2020 (accessed Apr. 23, 2020). Available from: https://www.palmsens-.com/shared/content/uploads/2020/04/EmStat-series-description.pdf.

32. BV M A. Metrohm Autolab—hardware specification; 2020 (accessed Apr. 23, 2020). Available from: https://www.metrohm-autolab.com/download/Autolab_Brochure_2013_EN_LR.pdf.

33. Inc N S. Arraystat—The ultimate tool for high throughput electrochemistry; 2011 (accessed Apr. 23, 2020). Available from: http://nuvant.com/arraystat/arraystat.pdf.

34. Jafari M, Marquez G, Selberg J, Jia M, Dechiraju H, Pansodtee P, et al. Feedback Control of Bioelectronic Devices Using Machine Learning. IEEE Control Systems Letters. 2020.

35. Bard A J, Faulkner L R, et al. Fundamentals and applications. Electrochemical Methods. 2001; 2 (482): 580-632.

36. Grdeń M, Lukaszewski M, Jerkiewicz G, Czerwiński A. Electrochemical behaviour of palladium electrode: Oxidation, electrodissolution and ionic adsorption. Electrochimica Acta. 2008; 53(26):7583-7598. https://doi.org/10.1016/j.electacta.2008.05.046

37. Selberg J, Jafari M, Bradley C, Gomez M, Rolandi M. Expanding biological control to bioelectronics with machine learning. APL Materials. 2020; 8(12):120904. https://doi.org/10.1063/5.0027226

38. Further information on one or more embodiments of the present invention can be found in "Open-Hardware Electronic Embedded Systems for Biological Cell Culturing," by Pattawong Pansodtee, PhD thesis, University of California, Santa Cruz, December 2021.

39. Further information on one or more embodiments of the present invention can also be found in https://journal-s.plos.org/posone/article?id=10.1371/journal.pone.0257167.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A potentiostat, comprising:
a base printed circuit board;
a power supply; a multiplexer; a clock; and a computer mounted on and electrically connected to the base printed circuit board; and
one or more modules each comprising a stackable printed circuit board, wherein the one or more modules each comprise a potentiostat circuit connectable to the base printed circuit board, wherein the potentiostat circuit controls a voltage between two or more electrodes in an electrochemical cell;
a mount capable of attaching a plurality of the stackable printed circuit boards to the base printed circuit board; and
the potentiostat can be modularly configured for controlling a selected plurality of channels each applying one of the voltages and receiving a response from one or more of a selected number of the two or more electrodes.
2. The potentiostat of claim 1, wherein the potentiostat circuit comprises:
one or more switches for electrically connecting or disconnecting to the two or more electrodes;
an output stage comprising a digital to analog converter (DAC) circuit and a first level shifter circuit, wherein the first level shifter circuit is electrically connected to one or more of the switches and the DAC circuit is electrically connected to the multiplexer; and
an input stage comprising a current to voltage converter circuit electrically connected to one or more of the switches; a second level shifter circuit connected to a first output of the current to voltage converter circuit; and an analog to digital converter (ADC) circuit connected to a second output of the second level shifter circuit, wherein the ADC circuit is electrically connected to the multiplexer.
3. The potentiostat of claim 2; wherein:
the first level shifter circuit at least scales or shifts a DAC voltage output from the DAC circuit to the voltage comprising a desired level applied between the two or more electrodes; and
the second level shifter circuit at least scales or shifts a voltage output from the current to voltage circuit into an acceptable range for input to the ADC circuit.
4. The potentiostat of claim 2, wherein the current to voltage converter comprises a shunt resistor connected to an amplifier.

5. The potentiostat of claim 2, wherein:
each of the stackable printed circuit boards simultaneously control the voltage applied to the two or more electrodes comprising between 2-8 electrodes,
each of the switches independently connect or disconnect to the electrodes independently.
6. The potentiostat of claim 2 connected to between 8 and 64 of the electrodes and further comprising a plurality of the stackable printed circuit boards, each of the stackable printed circuit boards connected to a subset of the electrodes so as to control the voltage applied to the subset of the electrodes, wherein:
each of the stackable printed circuit boards simultaneously control the voltage applied to the electrodes, and
each of the switches independently connect or disconnect to the electrodes independently.
7. The potentiostat of claim 2, wherein the computer comprises one or more processors; one or more memories; and one or more applications stored in the one or more memories, wherein at least one of the applications executed by the one or more processors:
initializes the DAC circuit, the ADC circuit, and the clock;
calibrates the potentiostat, comprising:
electrically disconnecting the one or more switches from the two or more electrodes and measuring ADC output voltages outputted from the ADC circuit during a no-load (open circuit) condition so as to obtain measurement recordings; and
averaging the measurement recordings to obtain a baseline;
executes a measurement protocol selected by a user, comprising obtaining real-time current measurement values in response to the voltages applied to a sample via the two or more electrodes.
8. The potentiostat of claim 7, wherein one or more of the applications executed by one or more of the processors implement an Application Program Interface (API) allowing the user to control the potentiostat remotely from a remote computer via a wireless or wired connection to the computer,
the API enables the user, via the remote computer, to configure and set the voltages applied to the two or more electrodes and receive current measurements outputted from the two or more electrodes in response to the voltages, and
one or more of the applications, executed on the computer coupled to the potentiostat, log timestamps, voltage output of different ones of the electrodes, and the current measurements received in response to the voltages.
9. The potentiostat of claim 7 wherein one or more applications execute a machine learning algorithm controlling the voltages or analyzing data obtained using the potentiostat.
10. The potentiostat of claim 1, wherein the computer comprises, consists of, or consists essentially of a single board computer or an embedded computer.
11. The potentiostat of claim 1, wherein the computer is a Raspberry Pi computer.
12. The potentiostat of claim 1, wherein the computer comprises an Application Specific Integrated Circuit or a Field Programmable Gate Array.
13. The potentiostat of claim 2, wherein the current to voltage converter circuit receives, via one or more of the switches, one or more currents outputted from one or more of the electrodes in response to one or more voltages outputted from the first level shifter circuit and applied to one or more of the two or more electrodes via one or more of the switches.

14. The potentiostat of claim 13, wherein the electrodes are in the electrochemical cell.

15. The potentiostat of claim 2, wherein the one or more switches independently connect or disconnect to the two or more electrodes so as to apply the voltages, adjustable in a range of ±4 V, and receive a maximum currents in a range ±1.5 μA, wherein the voltages and maximum currents are independently adjustable for each of the electrodes or pair of the two or more electrodes.

16. The potentiostat of claim 2, wherein the one or more switches comprise analog switches.

17. An analyte sensor comprising the potentiostat of claim 1, wherein one or more of the two or more electrodes are in contact with an analyte and the voltages are applied so as to sense the analyte.

18. An imaging system connected to the potentiostat of claim 1, comprising obtaining amperometric data using the voltages applied to the two or more electrodes, wherein the imaging system correlates fluorescence of a sample with the amperometric data.

19. The potentiostat of claim 1, wherein the stackable printed circuit board and the base printed circuit board each have at least one of a length less than 100 millimeters or a width less than 100 millimeters or a surface area less than 100 mm by 100 mm.

20. The potentiostat of claim 1, wherein:

the clock controls timing of the voltages applied to the two or more electrodes and receipt at the two or more electrodes of the response to the voltages, the multiplexer is configured to control the voltages applied in the selected number of channels to the selected number of two or more electrodes, and the power supply provides power required to supply all the voltages.

*   *   *   *   *